US012763145B2

(12) United States Patent
Guo et al.

(10) Patent No.: US 12,763,145 B2
(45) Date of Patent: Oct. 13, 2026

(54) NON-VOLATILE MEMORY WITH HOLE PRE-CHARGE AND ISOLATED SIGNAL LINES

(71) Applicant: Sandisk Technologies, Inc., Milpitas, CA (US)

(72) Inventors: Jiacen Guo, Sunnyvale, CA (US); Xiang Yang, Santa Clara, CA (US); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 320 days.

(21) Appl. No.: 18/357,399

(22) Filed: Jul. 24, 2023

(65) Prior Publication Data

US 2024/0203506 A1 Jun. 20, 2024

Related U.S. Application Data

(60) Provisional application No. 63/433,869, filed on Dec. 20, 2022.

(51) Int. Cl.

*G11C 5/06* (2006.01)
*G11C 16/10* (2006.01)
*G11C 16/34* (2006.01)

(52) U.S. Cl.

CPC ............ *G11C 16/102* (2013.01); *G11C 5/063* (2013.01); *G11C 16/3404* (2013.01)

(58) Field of Classification Search

CPC ... G11C 16/102; G11C 5/063; G11C 16/3404; G11C 16/0483; G11C 16/10; G11C 16/24; G11C 16/3418

See application file for complete search history.

(56) References Cited

U.S. PATENT DOCUMENTS 7,623,386 B2 11/2009 Dong et al.
9,947,682 B2 4/2018 Mokhlesi et al.
10,957,394 B1 * 3/2021 Chen ...................... G11C 16/10
11,081,162 B1 8/2021 Puthenthermadam et al.
2008/0198668 A1 8/2008 Ueno
2015/0263074 A1 9/2015 Takaki
2016/0005476 A1 * 1/2016 Park ..................... G11C 16/344 365/185.25
2019/0333592 A1 10/2019 Lee et al.
2021/0217859 A1 7/2021 Chang et al.
2021/0408024 A1 12/2021 Puthenthermadam et al.
2024/0386961 A1 * 11/2024 S ............................ G11C 16/24

* cited by examiner

*Primary Examiner* — Mohammed A Bashar
(74) *Attorney, Agent, or Firm* — PEARL COHEN LLP

(57) ABSTRACT

A non-volatile memory system programs memory cells from an erased threshold voltage distribution to programmed threshold voltage distributions by performing hole pre-charging of channels of unselected NAND strings in a selected block of a selected plane including applying a source voltage to a selected signal line of a plurality of signal lines that are isolated from each other. The selected signal line is positioned between the selected block and an unselected block and is connected to a selected source line of a plurality of source lines that are isolated from each other. The selected source line is connected to the selected block. The source voltage is greater in magnitude than any predetermined threshold voltage of the erased threshold voltage distribution. After the pre-charging, the system boosts channels of unselected NAND strings in the selected block and applies a program voltage to selected NAND strings in the selected block.

19 Claims, 19 Drawing Sheets

Figure 4C1
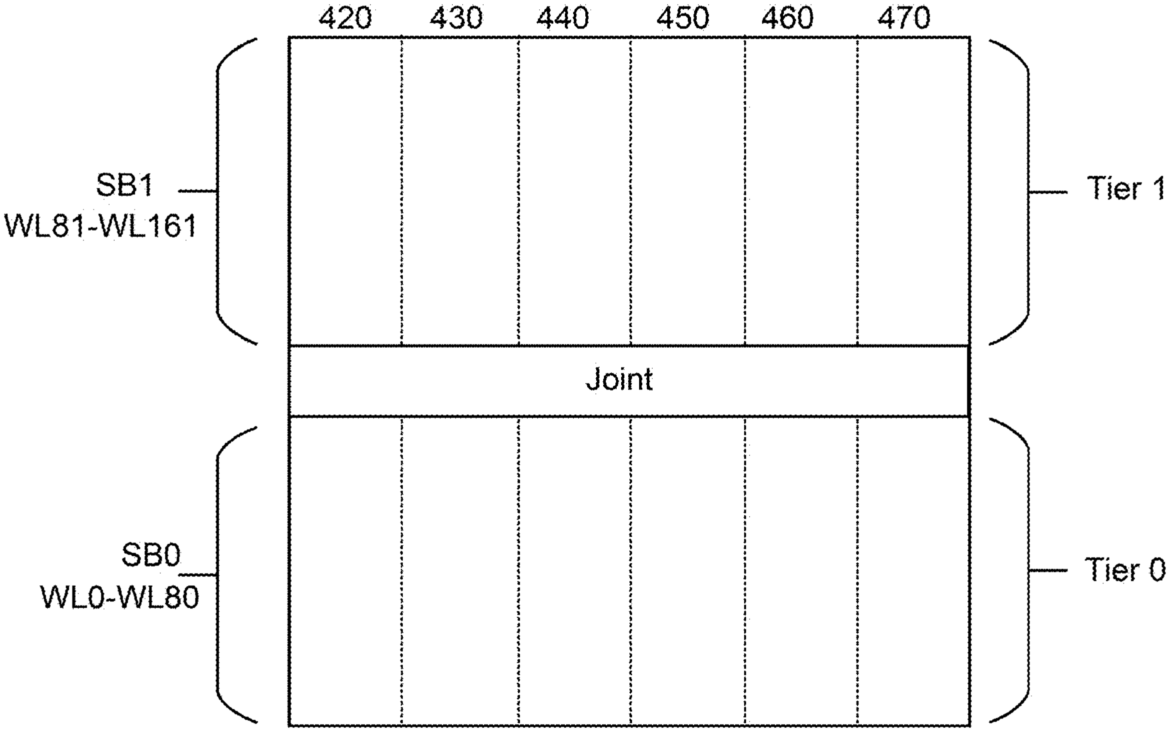

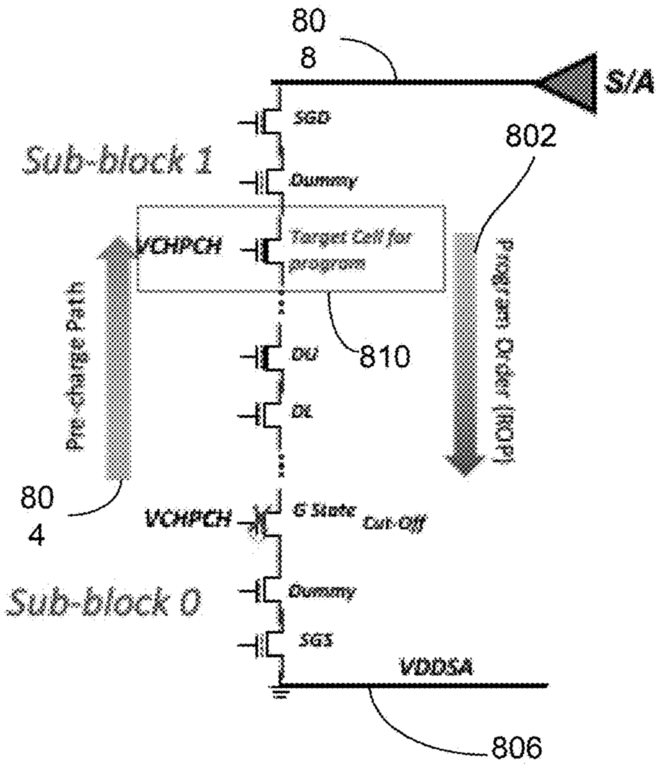
Figure 7
Figure 8
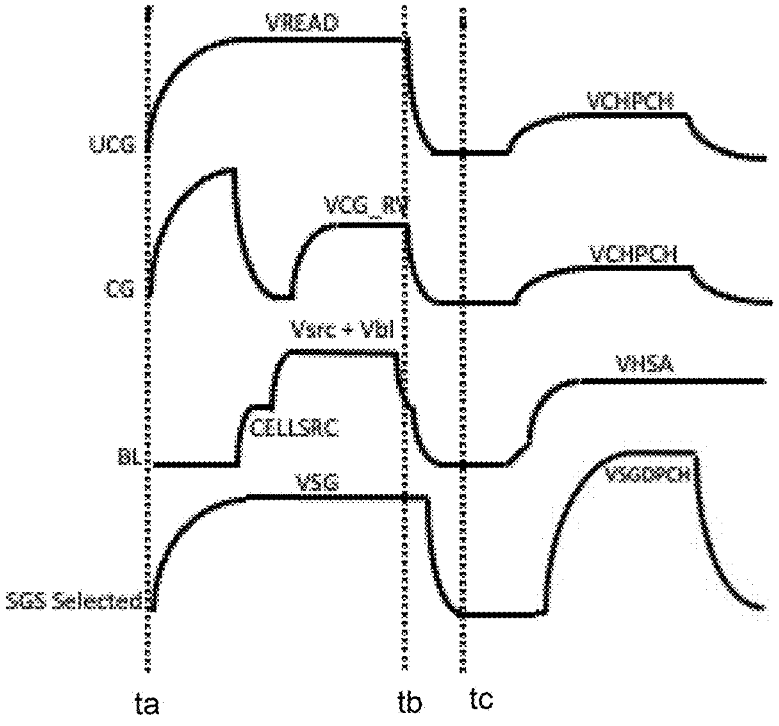

NON-VOLATILE MEMORY WITH HOLE PRE-CHARGE AND ISOLATED SIGNAL LINES

CLAIM TO PRIORITY

The present application claims priority from U.S. Provisional Patent Application No. 63/433,869, entitled "NON-VOLATILE MEMORY WITH HOLE PRE-CHARGE AND ISOLATED SIGNAL LINES", filed Dec. 20, 2022, incorporated by reference herein in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

Additionally, many electronic devices that use non-volatile memory are mobile devices that rely on batteries for power. Therefore, it is advantageous for the non-volatile memory to use less power.

BRIEF DESCRIPTION OF THE DRAWINGS

Like-numbered elements refer to common components in the different figures.

FIG. 4C1 depicts a cross sectional view of a portion of one embodiment of a block of memory cells, showing two sub-blocks.

FIG. 7 depicts a NAND string being pre-charged as part of a process to inhibit the NAND string from programming during a programming process.

FIG. 8 is a signal diagram describing the behavior of various signals during program-verify and pre-charging.

DETAILED DESCRIPTION

Some memory systems program memory cells by applying doses of programming to a selected word line that is connected to memory cells selected for programming (selected memory cells). Between the doses of programming, program-verify is performed to determine whether the programming was successful. Because a selected word line can be connected to selected memory cells and unselected memory cells (i.e. memory cells that are not supposed to be programmed), the system takes measures to avoid a disturb (e.g., unwanted programming) of unselected memory cells, including pre-charging and boosting the voltage of channels of unselected memory cells to prevent a disturb. The pre-charging is typically performed after program-verify and before the next dose of programming. The boosting is performed after the pre-charging. In some memories, under certain conditions, standard electron pre-charging does not work properly due to a negative coupling of the channel to word line voltages being lowered at the end of program-verify. To overcome the negative coupling issues, it is proposed to use hole pre-charging rather than electron pre-charging. To accomplish the hole pre-charging, a large voltage (source voltage) is applied to the source line. Because the source lime is connected to an entire plane, applying the large source voltage will consume a large amount of current. Therefore, in order to make use of hole pre-charging, without consuming too much current, it is proposed to isolate the signals lines that provide the source voltage, including dividing the source line into multiple source lines that are isolated from each other such that each source line is connected to one of the signal lines. In this manner, a smaller portion of the plane will receive the large source voltage, which reduces current consumption.

Figure 1:
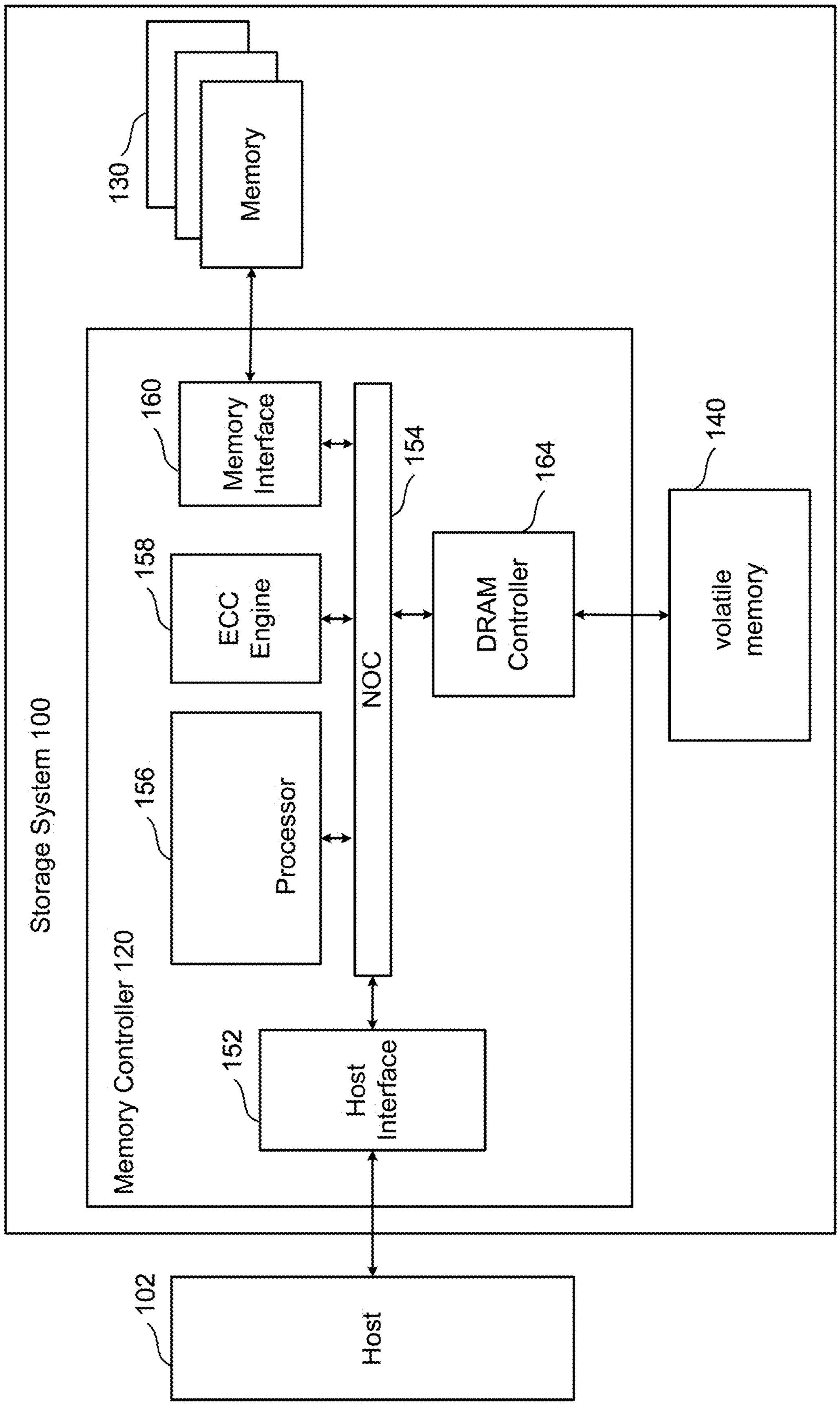
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
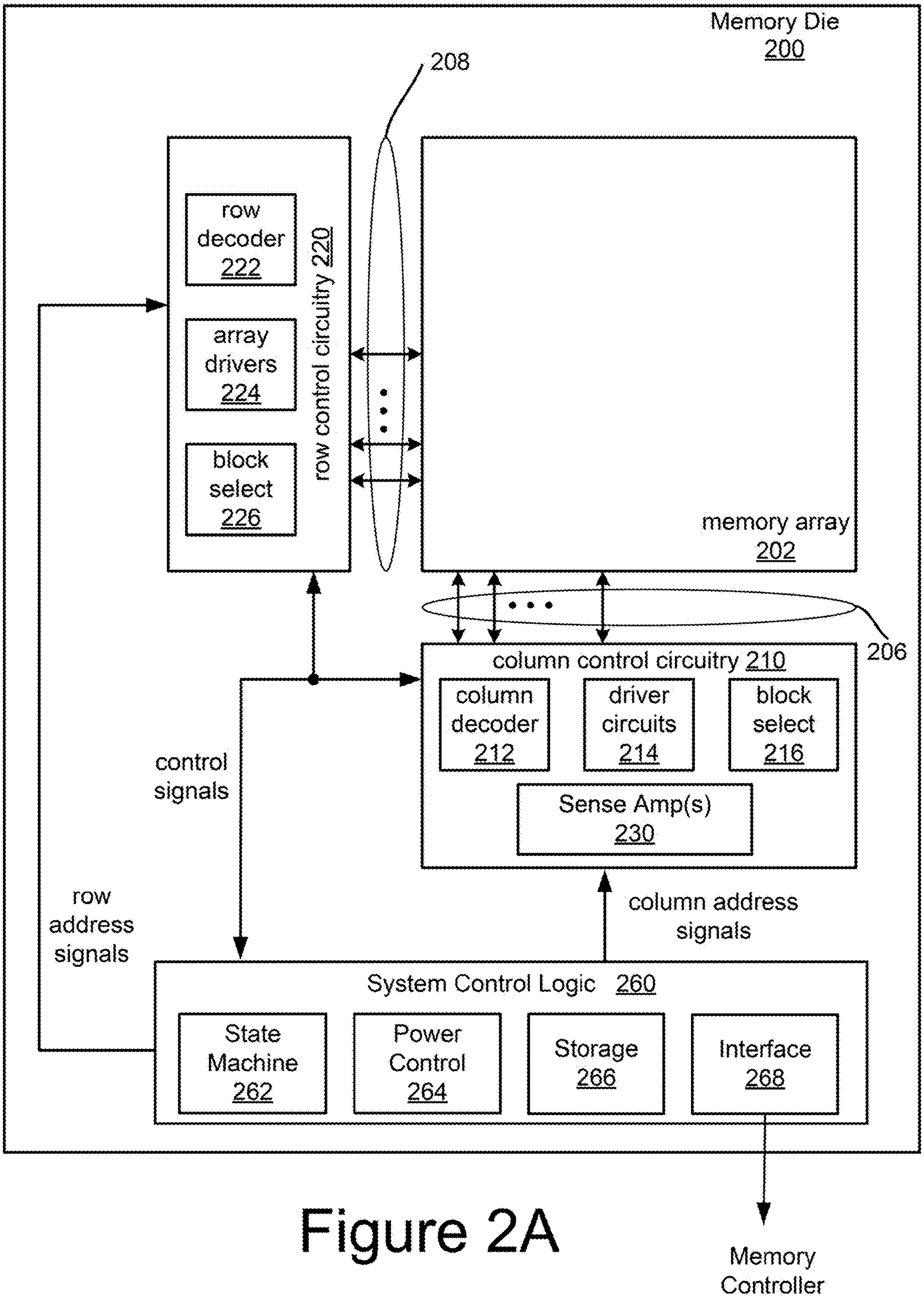
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory dic) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
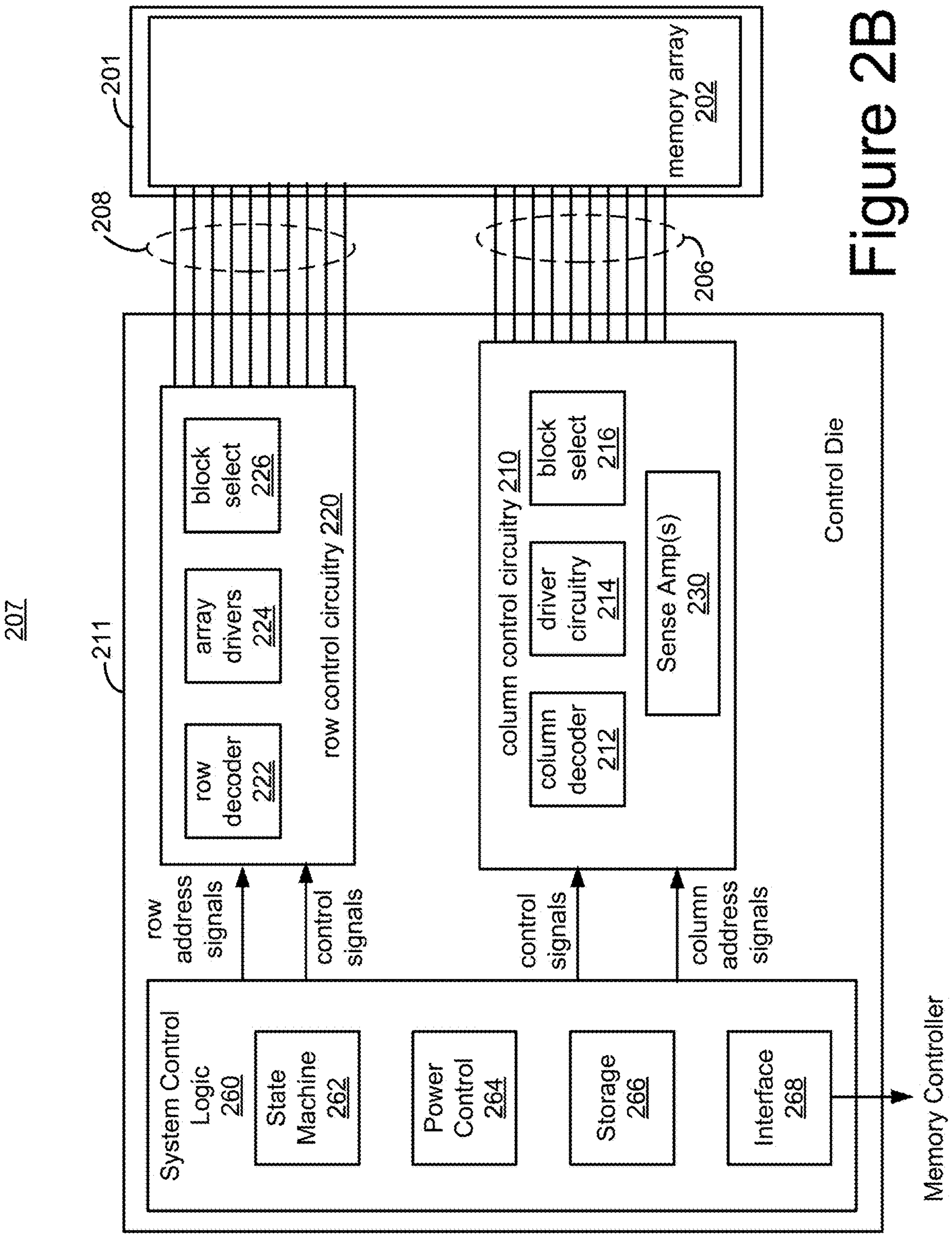
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
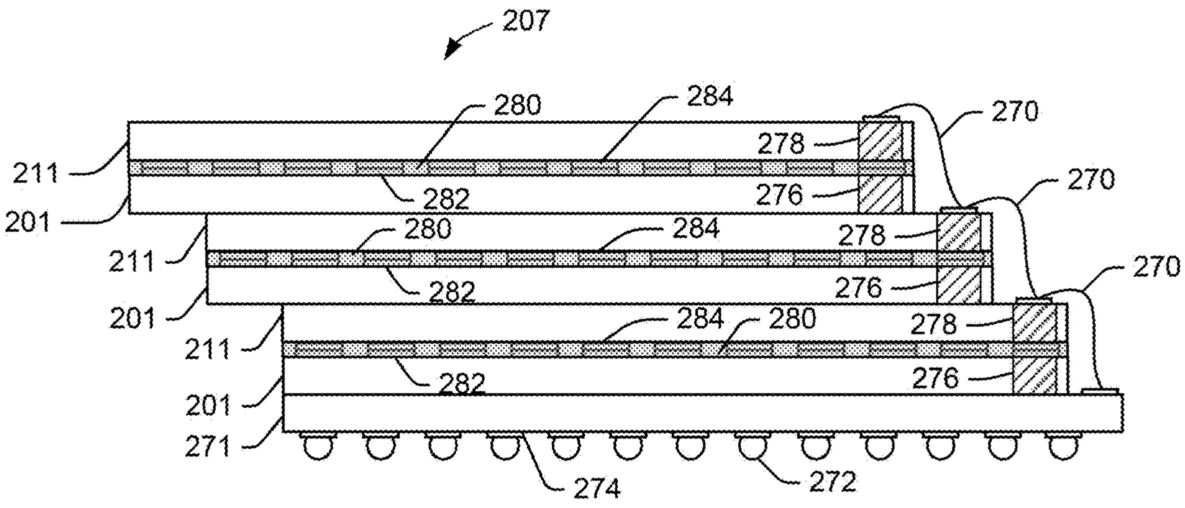
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control dies 211 and multiple memory dies 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control dies 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
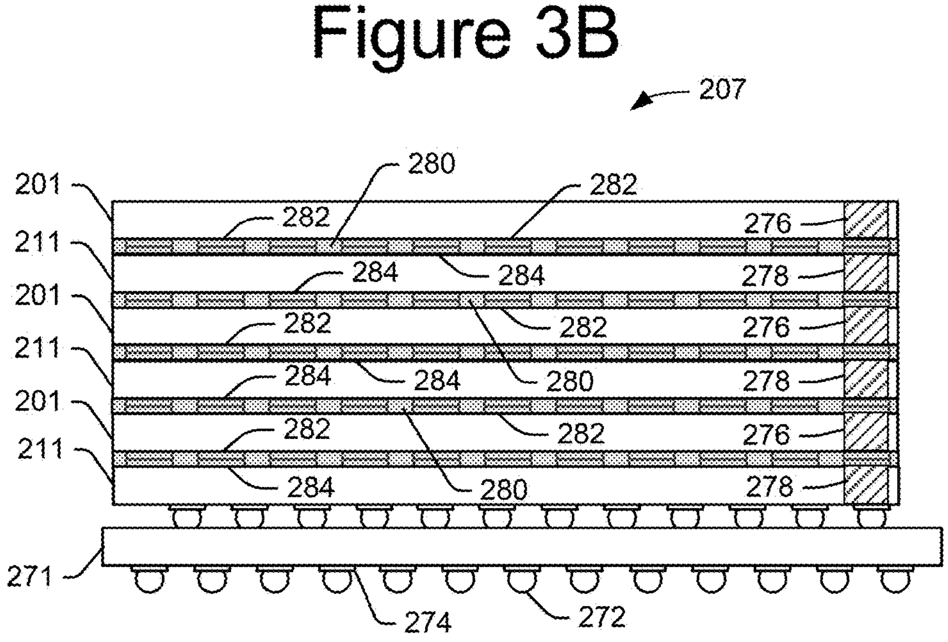

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on the surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
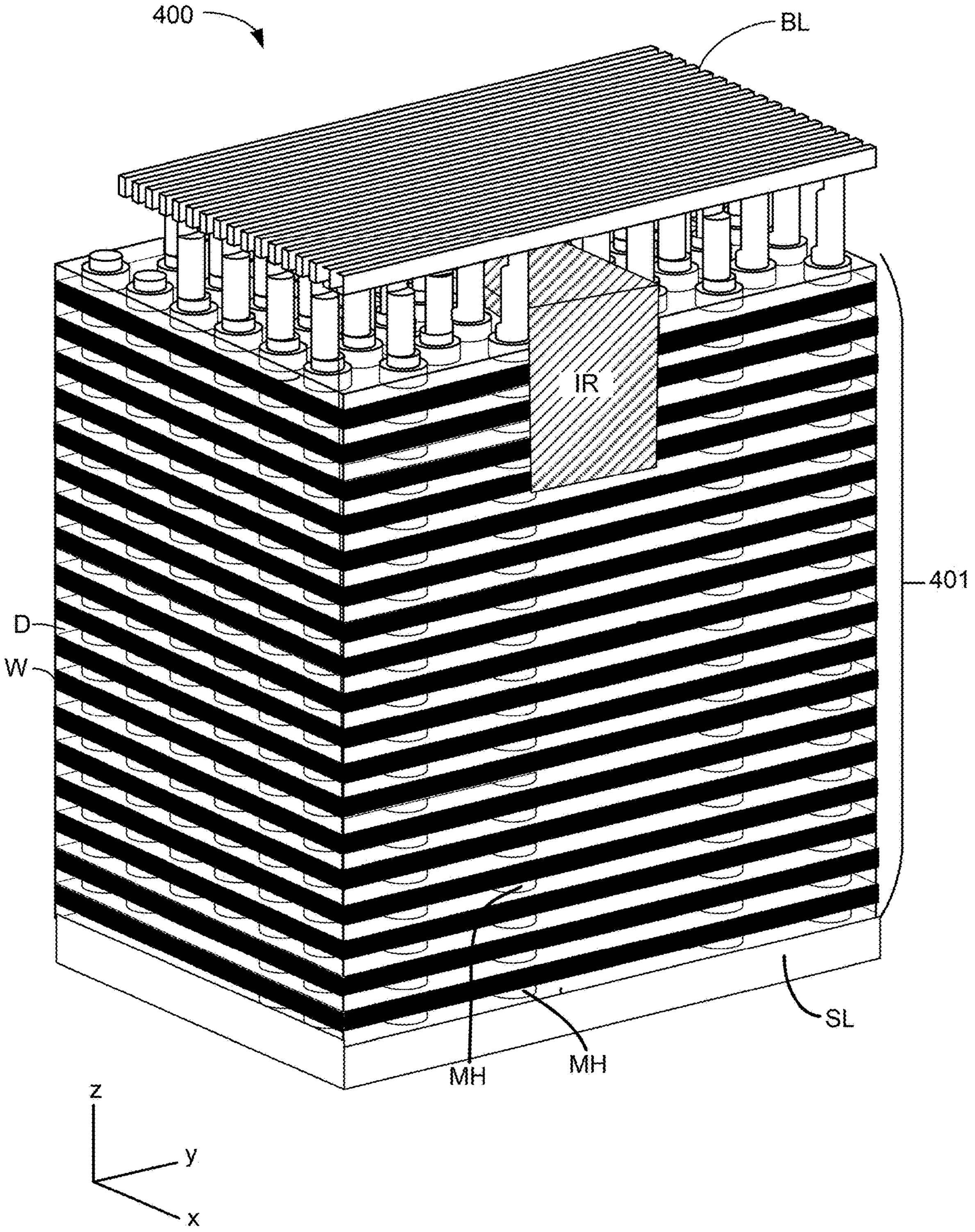
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality of non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. Thus, the non-volatile memory cells are arranged in memory holes. More details of the three dimensional monolithic memory array that comprises memory structure 202 is provided below.

Figure 4A:
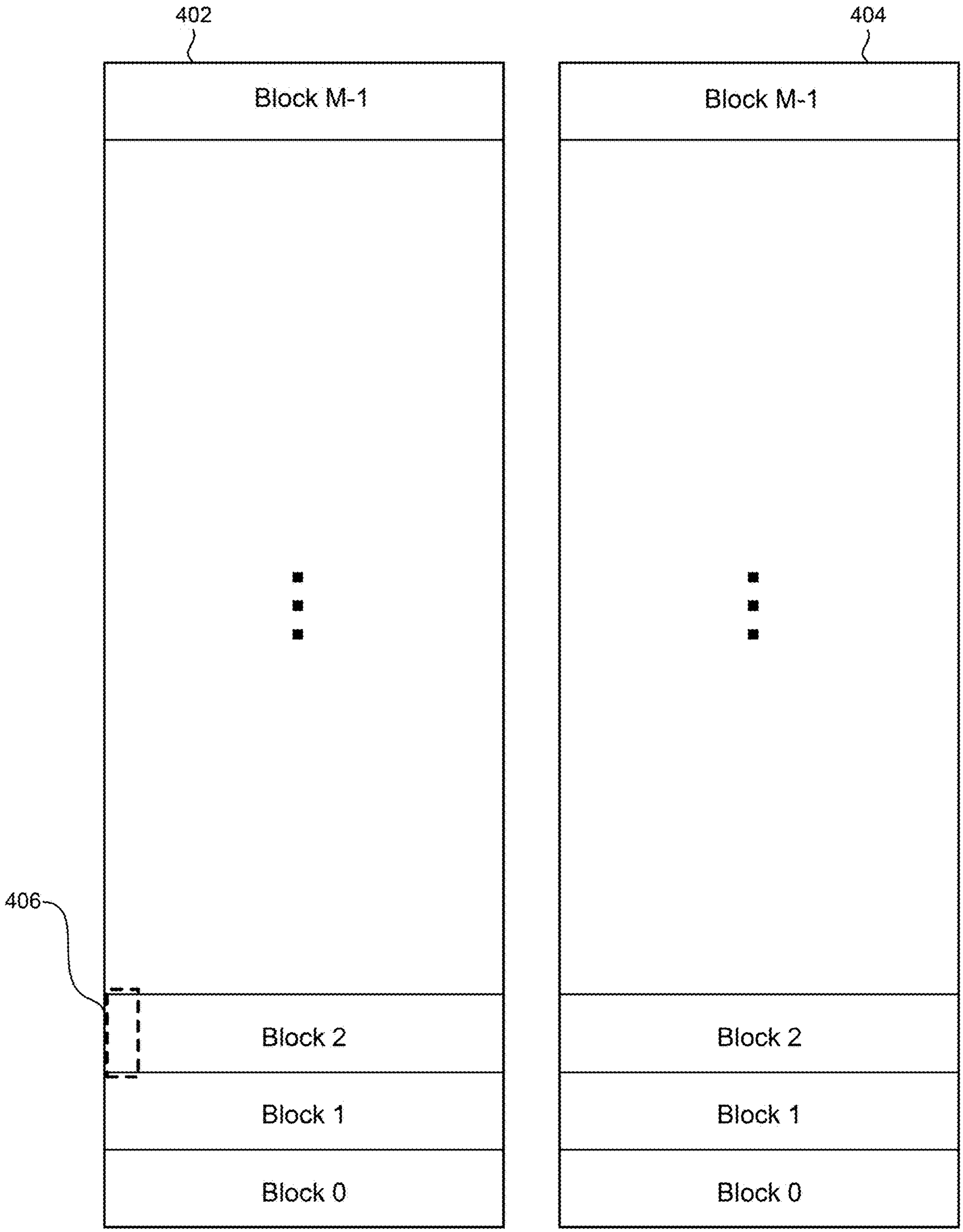
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
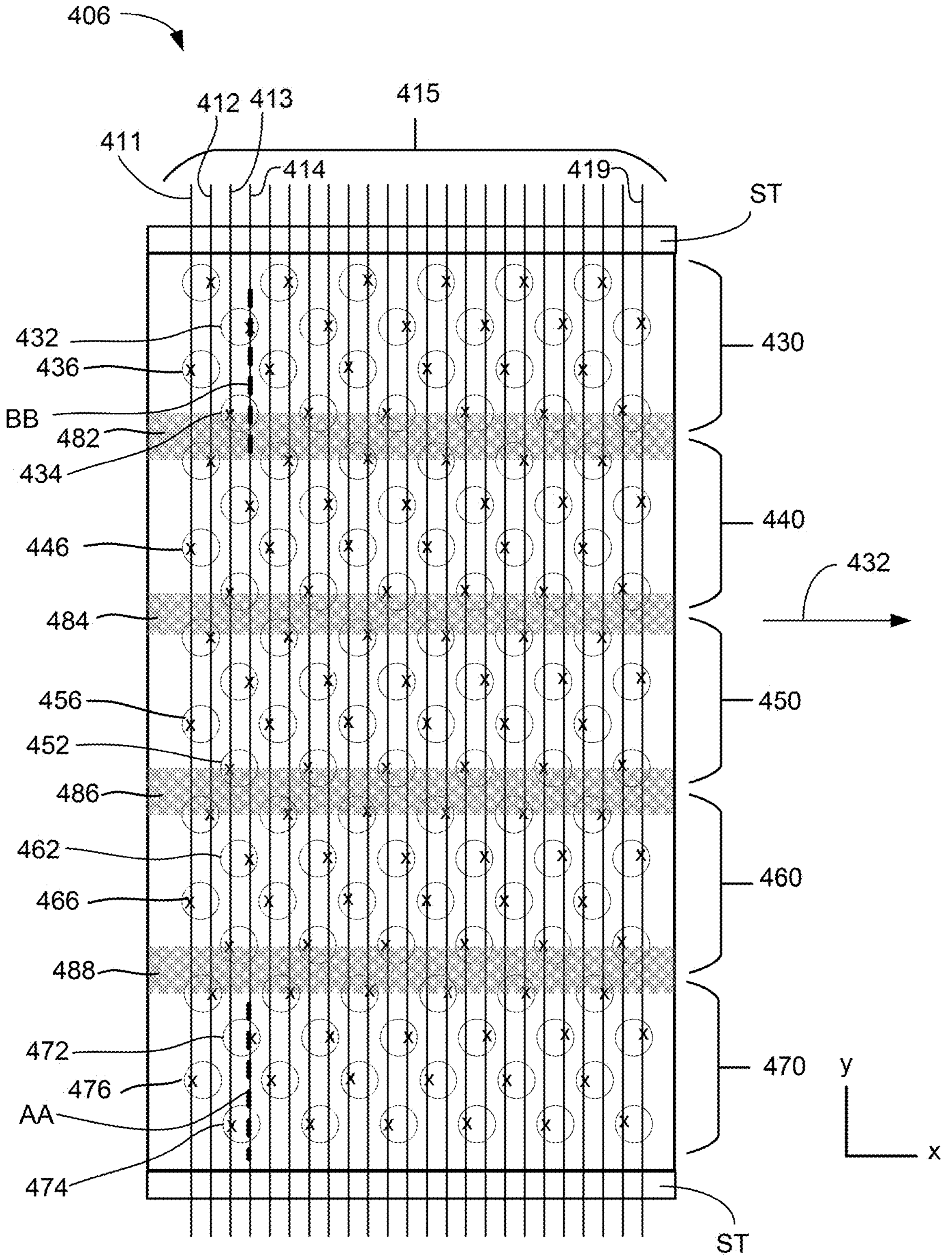
FIG. 4B depicts a top view of a portion of one embodiment of a block of memory cells.

FIGS. 4B-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 411 is connected to memory holes/vertical columns 436, 446, 456, 466 and 476.

The block depicted in FIG. 4B includes a set of isolation regions 482, 484, 486 and 488, which are formed of $SiO_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470. In one embodiment, the isolation regions only divide the layers used to implement select gates so that NAND strings in different regions can be independently selected. In one example implementation, a bit line connects to one memory hole/vertical column/NAND string in each of regions 430, 440, 450, 460 and 470. In that implementation, each block has twenty four rows of active columns and each bit line connects to five rows in each block. In one embodiment, all of the five memory holes/vertical columns/NAND strings connected to a common bit line are connected to the same set of word lines; therefore, the system uses the drain side selection lines to choose one (or another subset) of the five to be subjected to a memory operation (program, verify, read, and/or erase).

FIG. 4B also shows line interconnects ST, which are metal connections to the source line SL from above the memory array. Line interconnects/signal lines ST are positioned adjacent regions 430 and 470. Therefore, the line interconnects/signal lines ST are positioned between each pair of neighboring blocks.

Although FIG. 4B shows each region 430, 440, 450, 460 and 470 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block. FIG. 4B also shows the memory holes/vertical columns being staggered. In other embodiments, different patterns of staggering can be used. In some embodiments, the memory holes/vertical columns are not staggered.

Figure 4C:
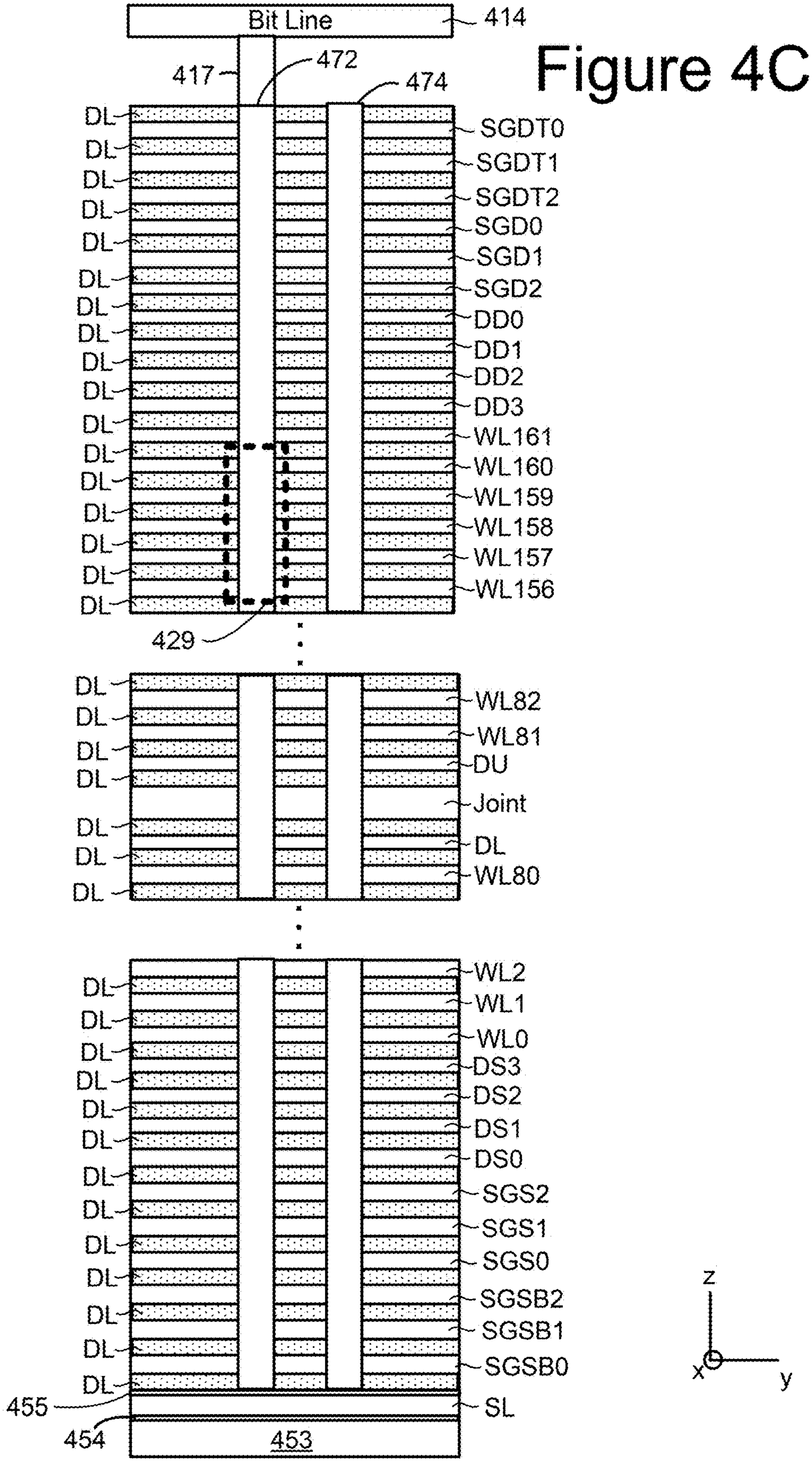
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through memory holes/vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three drain side GIDL generation transistor layers SGDT0, SGDT1, and SGDT2; three source side GIDL generation transistor layers SGSB0, SGSB1, and SGSB2; four drain side dummy word line layers DD0, DD1, DD2 and DD3; four source side dummy word line layers DS0, DS1, DS2 and DS3; dummy word line layers DU and DL; one hundred and sixty two word line layers WL0-WL161 for connecting to data memory cells, and dielectric layers DL. Other embodiments can implement more or less than the numbers described above for FIG. 4C. In one embodiment, SGD0, SGD1 and SGD2 are connected together; and SGS0, SGS1 and SGS2 are connected together. In other embodiments, more or less number of SGDs (greater or lesser than three) are connected together, and more or less number of SGSs (greater or lesser than three) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4C shows three GIDL generation transistors at each end of the NAND string; however, in other embodiments there are more or less than three. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows three GIDL generation transistors at each end of the NAND string. It is likely that charge carriers are only generated by GIDL at one of the three GIDL generation transistors at each end of the NAND string. Based on process variances during manufacturing, it is likely that one of the three GIDL generation transistors at an end of the NAND string is best suited for GIDL. For example, the GIDL generation transistors have an abrupt pn junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 472 and 474 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 453. Above substrate 453 is polysilicon layer 454 (P type Si), source line SL (n type Si) and a polysilicon layer 455 (P type Si). The NAND string of memory hole/vertical column 472 has a source end at a bottom of the stack and a drain end at a top of the stack. As in agreement with FIG. 4B, FIG. 4C show vertical memory hole/column 472 connected to bit line 414 via connector 417.

For ease of reference, drain side select layers; source side select layers, dummy word line layers, GIDL generation transistor layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-WL161 connect to memory cells (also called data memory cells). Dummy word line layers connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

FIG. 4C shows that the memory array is implemented as a two tier architecture, with the tiers separated by a Joint area. In one embodiment it is expensive and/or challenging to etch so many word line layers intermixed with dielectric layers. To ease this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint areas are positioned between the first stack and the second stack. In one embodiment, the Joint areas are made from the same materials as the word line layers. In other embodiments, there can be no Joint area or multiple Joint areas.

FIG. 4C1 depicts a side view of portion 406 of Block 2 of plane 402, that is also depicted in FIG. 4B. The side view of FIG. 4C1 shows an embodiment of the memory array implemented as a two tier architecture, with each tier separate by a Joint region (as per FIG. 4C). Each of regions 420-470 run across the tiers (and sub-blocks). The first tier (Tier 0) comprises word lines WL0-WL80. The second tier (Tier 1), which is positioned above Tier 0, comprises word lines WL81-WL161. More or less than 162 word lines can be used and different divisions of word lines to the tiers can be implemented.

In one set of embodiments, the memory can be implemented in sub-block mode. That is, blocks are divided into two or more sub-blocks and each sub-block can be independently and separately programmed, read and/or erased. FIG. 4C1 shows an example of a block divided into two sub-blocks: SB0 and SB1. Sub-block SB1 is positioned above sub-block SB0. In the depicted embodiment, the first sub-block SB0 comprises word lines WL0-WL80 and the second sub-block SB1 comprises word lines WL81-WL161; therefore, Tier 0 is operated as sub-block SB0 and Tier 1 is operated as sub-block SB1. However, in other examples, the tiers may correspond to different sub-blocks, or sub-blocks may correspond to partial tiers or more than one tier.

Figure 4D:
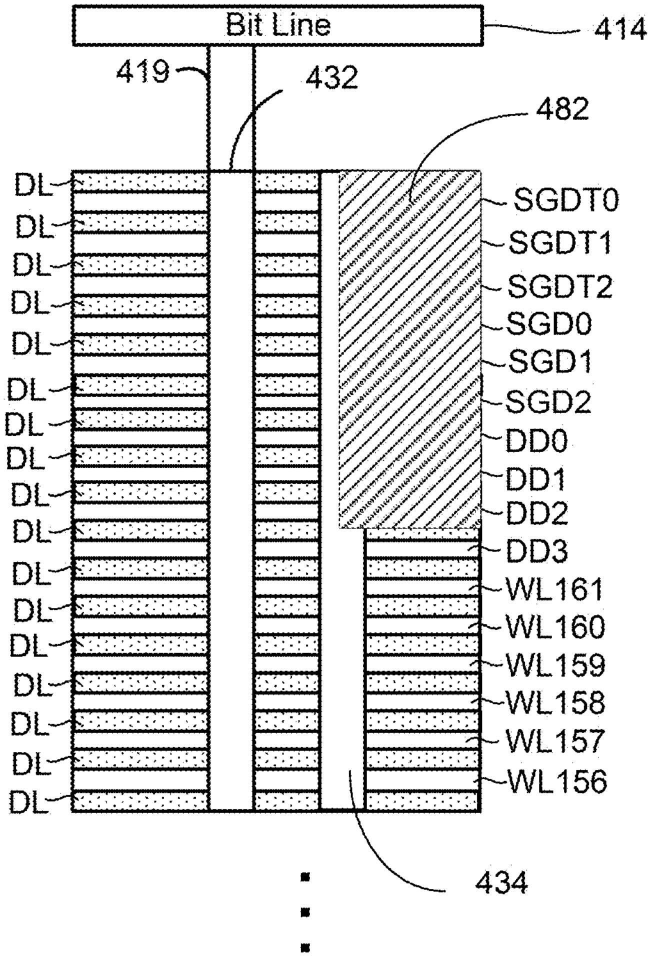
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through memory holes/vertical columns (NAND strings) 432 and 434 of region 430 (scc FIG. 4B). FIG. 4D shows the same alternating conductive and dielectric layers as FIG. 4C. FIG. 4D also shows isolation region 482. Isolation regions 482, 484, 486 and 488 occupy space that would have been used for a portion of the memory holes/vertical columns/NAND strings. For example, isolation region 482 occupies space that would have been used for a portion of memory hole/vertical column 434. More specifically, a portion (e.g., half the diameter) of vertical column 434 has been removed in layers SGDT0, SGDT1, SGDT2, SGD0, SGD1, SGD2, DD0, DD1 and DD2 to accommodate isolation region 482. Thus, while most of the vertical column 434 is cylindrical (with a circular cross section), the portion of vertical column 434 in layers SGDT0, SGDT1, SGDT2, SGD0, SGD1, SGD2, DD0, DD1 and DD2 has a semi-circular cross section. In one embodiment, after the stack of alternating conductive and dielectric layers is formed, the stack is etched to create space for the isolation region and that space is then filled in with $SiO_2$.

Figure 4E:
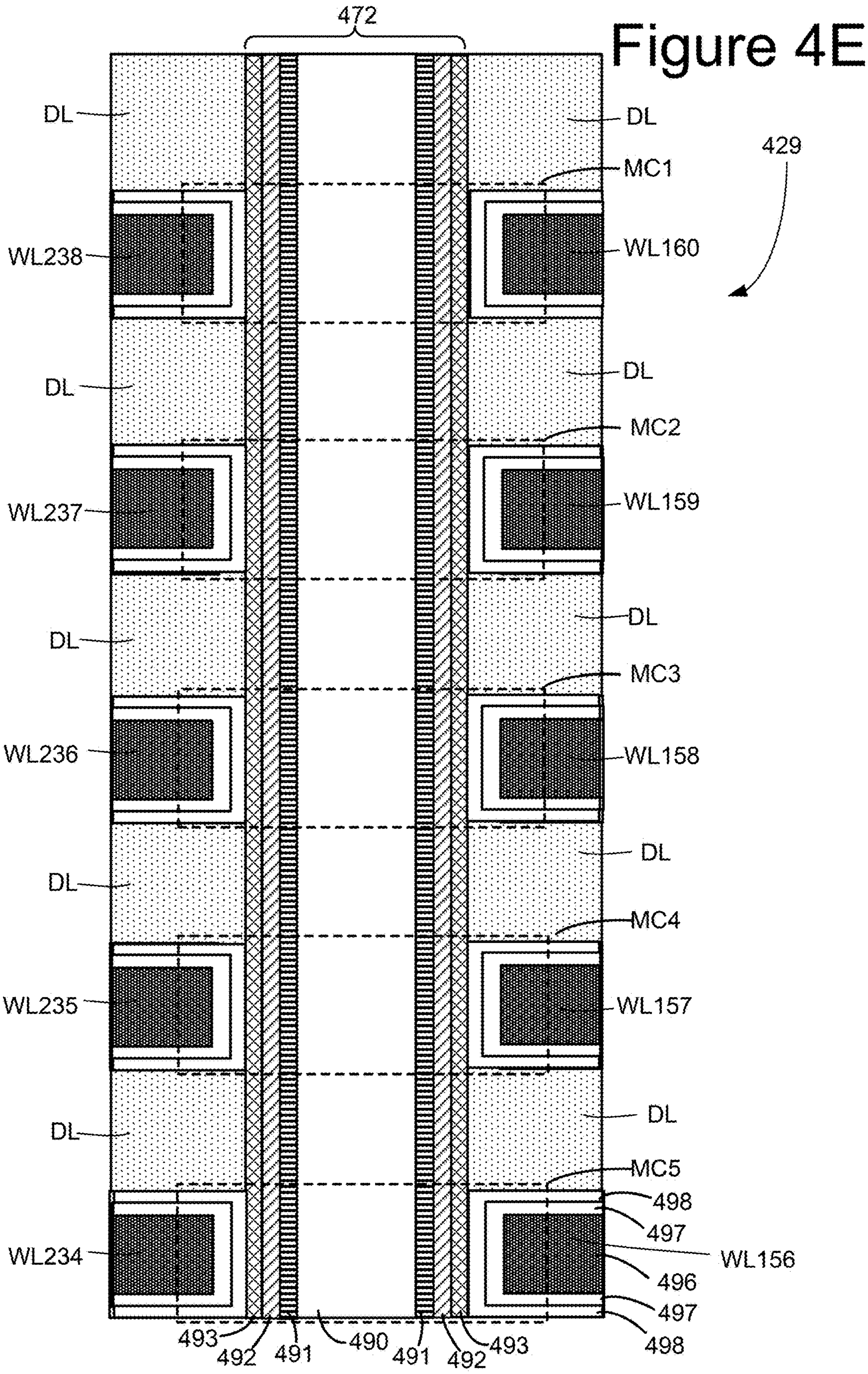
FIG. 4E is a cross sectional view of one embodiment of a vertical column of memory cells.

FIG. 4E depicts a cross sectional view of region 429 of FIG. 4C that includes a portion of memory hole/vertical column 472. In one embodiment, the memory holes/vertical columns are round; however, in other embodiments other shapes can be used. In one embodiment, memory hole/vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL160 and a portion of memory hole/vertical column 472 comprise a memory cell MC1. Word line layer WL159 and a portion of memory hole/vertical column 472 comprise a memory cell MC2. Word line layer WL158 and a portion of memory hole/vertical column 472 comprise a memory cell MC3. Word line layer WL157 and a portion of memory hole/vertical column 472 comprise a memory cell MC4. Word line layer WL156 and a portion of memory hole/vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
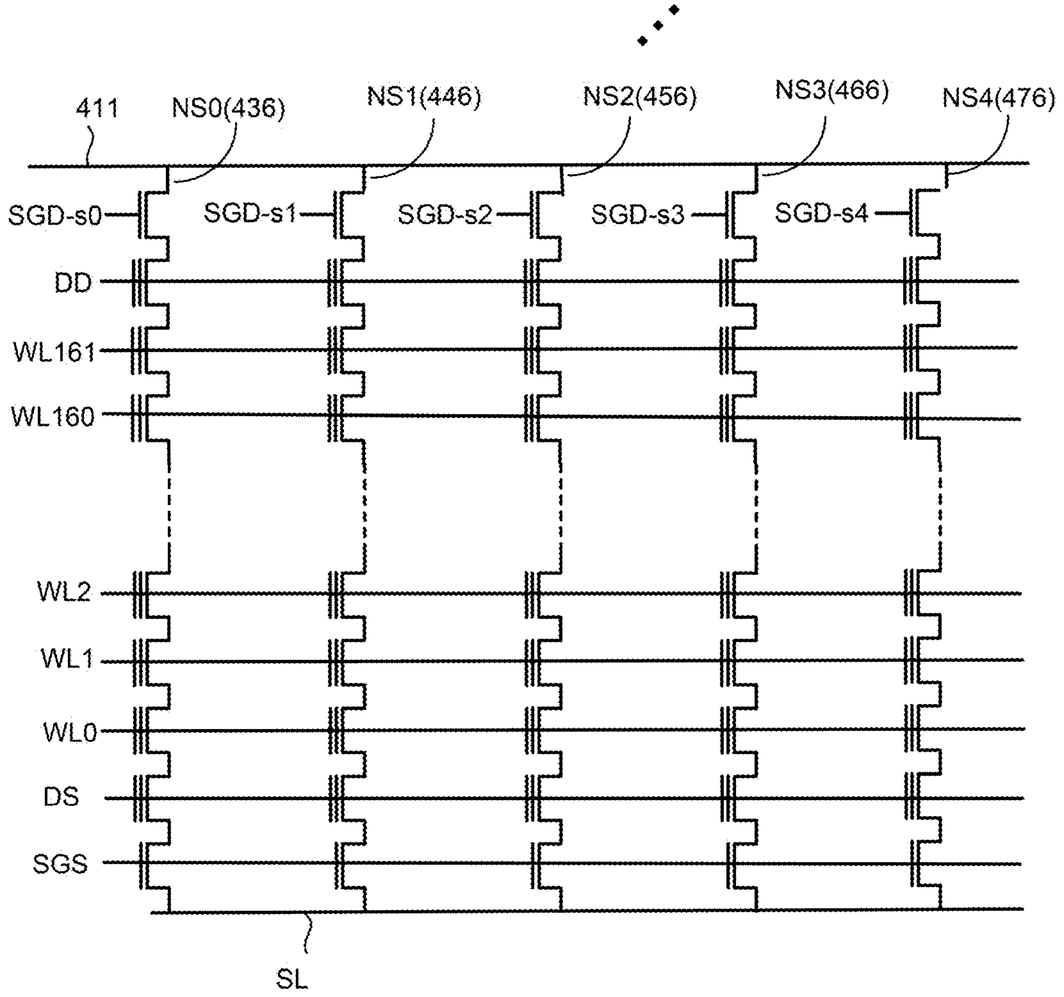
FIG. 4F is a schematic of a plurality of NAND strings in multiple regions of a same block.

FIG. 4F is a schematic diagram of a portion of the memory array 202 depicted in FIGS. 4-4E. FIG. 4F shows physical data word lines WL0-WL161 running across the entire block. The structure of FIG. 4F corresponds to a portion 406 in Block 2 of FIG. 4A, including bit line 411. Within the block, in one embodiment, each bit line is connected to five NAND strings. Thus, FIG. 4F shows bit line connected to NAND string NS0 (which corresponds to memory hole/vertical column 436), NAND string NS1 (which corresponds to memory hole/vertical column 446), NAND string NS2 (which corresponds to vertical column 456), NAND string NS3 (which corresponds to memory hole/vertical column 466), and NAND string NS4 (which corresponds to memory hole/vertical column 476). As mentioned above, in one embodiment, SGD0, SGD1 and SGD2 are connected together to operate as a single logical select gate for each region separated by isolation regions (482, 484, 486 and 488) to form SGD-s0, SGD-s1, SGD-s2, SGD-s3, and SGD-s4. SGS0, SGS1 and SGS2 are also connected together to operate as a single logical select gate that is represented in FIG. 4F as SGS. Although the select gates SGD-s0, SGD-s1, SGD-s2, SGD-s3, and SGD-s4 are isolated from each other due to the isolation regions, the data word lines WL0-WL161 of each region are connected together. Thus, data word lines WL0-WL161 are connected to NAND strings (and memory cells) of each (or every) region (430, 440, 450, 460, 470) of a block.

The isolation regions (482, 484, 486 and 488) are used to allow for separate control of regions 430, 440, 450, 460, 470. A first region corresponds to those vertical NAND strings controlled by SGD-s0. A second region corresponds to those vertical NAND strings controlled by SGD-s1. A third region corresponds to those vertical NAND strings controlled by SGD-s2. A fourth region corresponds to those vertical NAND strings controlled by SGD-s3. A fifth region corresponds to those vertical NAND strings controlled by SGD-s4.

FIG. 4F only shows NAND strings connected to bit line 411. However, a full schematic of the block would show every bit line and five vertical NAND strings (that are in separate regions) connected to each bit line.

Although the example memories of FIGS. 4-4F are three dimensional memory structure that includes vertical NAND strings with charge-trapping material, other (2D and 3D) memory structures can also be used with the technology described herein.

Figure 5A:
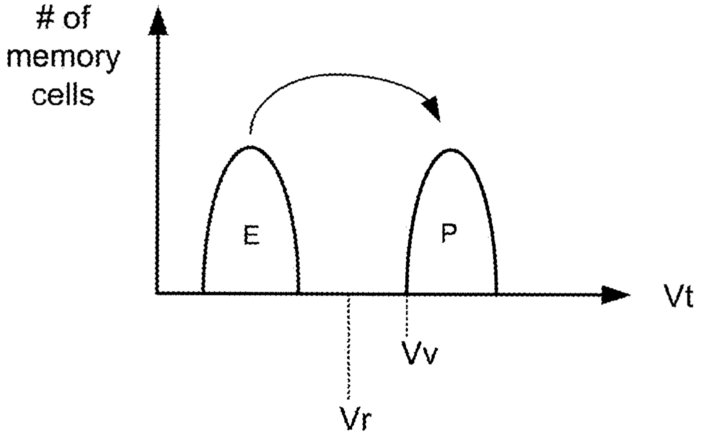
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
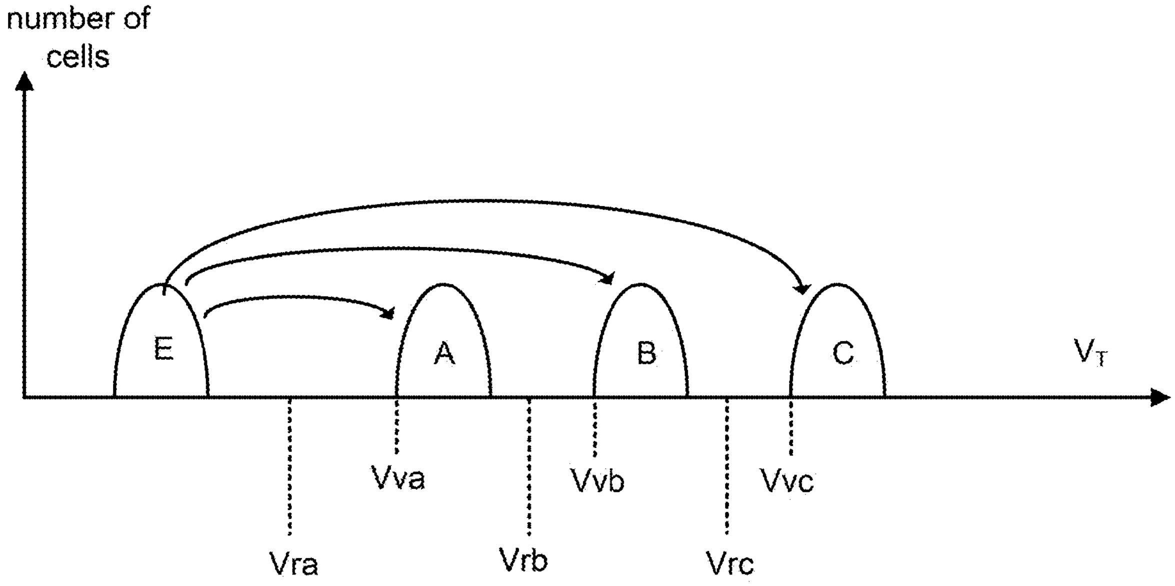
FIG. 5B depicts threshold voltage distributions.
Figure 5C:
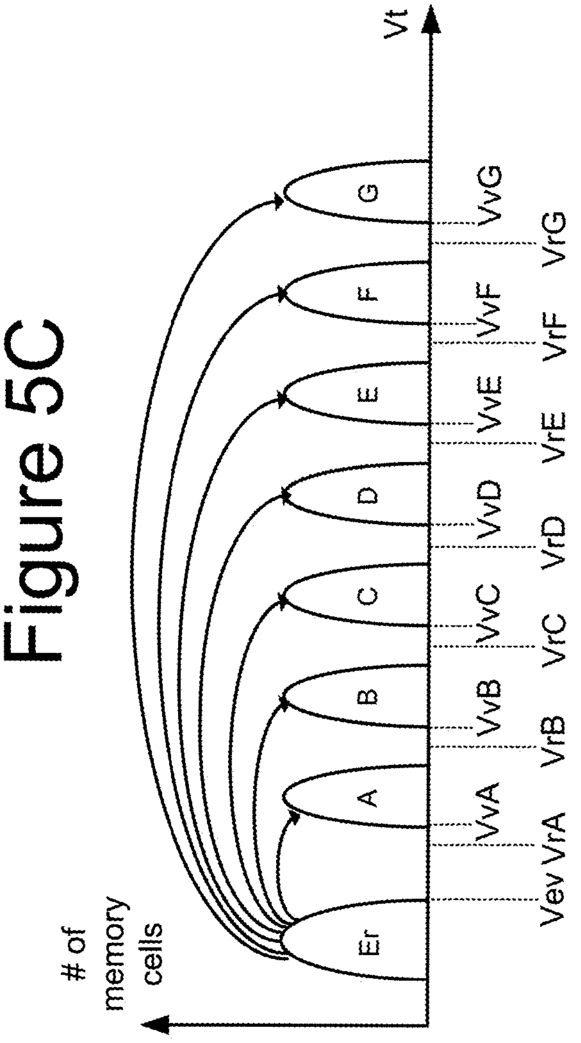
FIG. 5C depicts threshold voltage distributions.
Figure 5D:
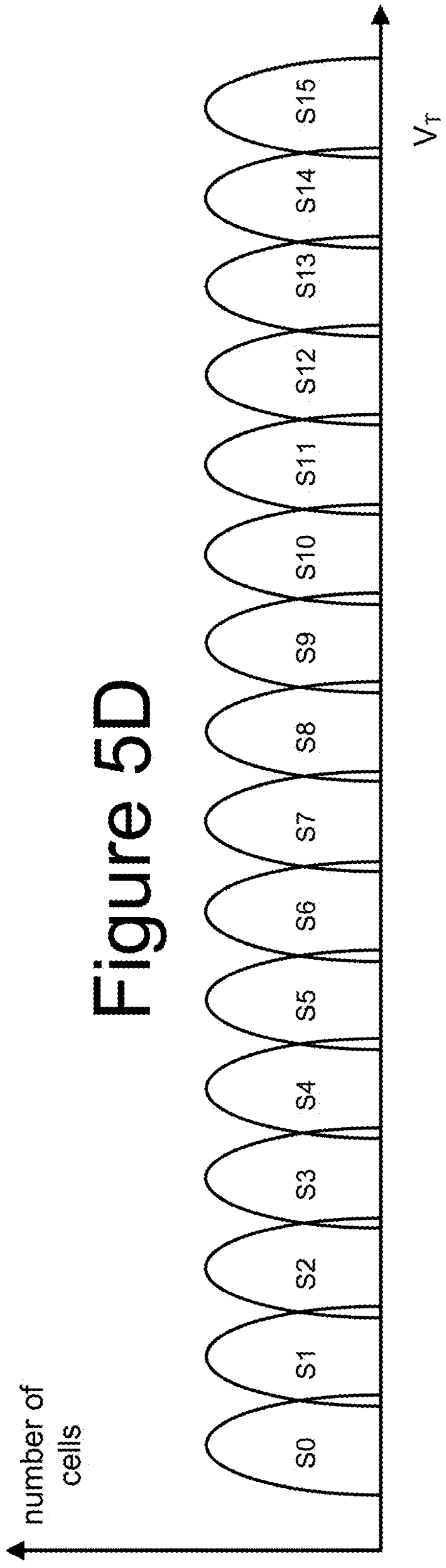
FIG. 5D depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

| | E | A | B | C |
|---|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

| | Er | A | B | C | D | E | F | G |
|---|---|---|---|---|---|---|---|---|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VVE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC. VVD, VVE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 1 | 1 | 1 | 1 | 0 | 0 | 0 | 0 | 0 | 1 | 1 | 0 | 0 | 0 | 1 |
| UP | 1 | 1 | 0 | 0 | 0 | 0 | 0 | 0 | 1 | 1 | 1 | 1 | 1 | 1 | 0 | 0 |
| MP | 1 | 1 | 1 | 0 | 0 | 0 | 0 | 1 | 1 | 0 | 0 | 0 | 0 | 1 | 1 | 1 |
| LP | 1 | 0 | 0 | 0 | 1 | 1 | 0 | 0 | 0 | 0 | 0 | 1 | 1 | 1 | 1 | 1 |

Figure 6:
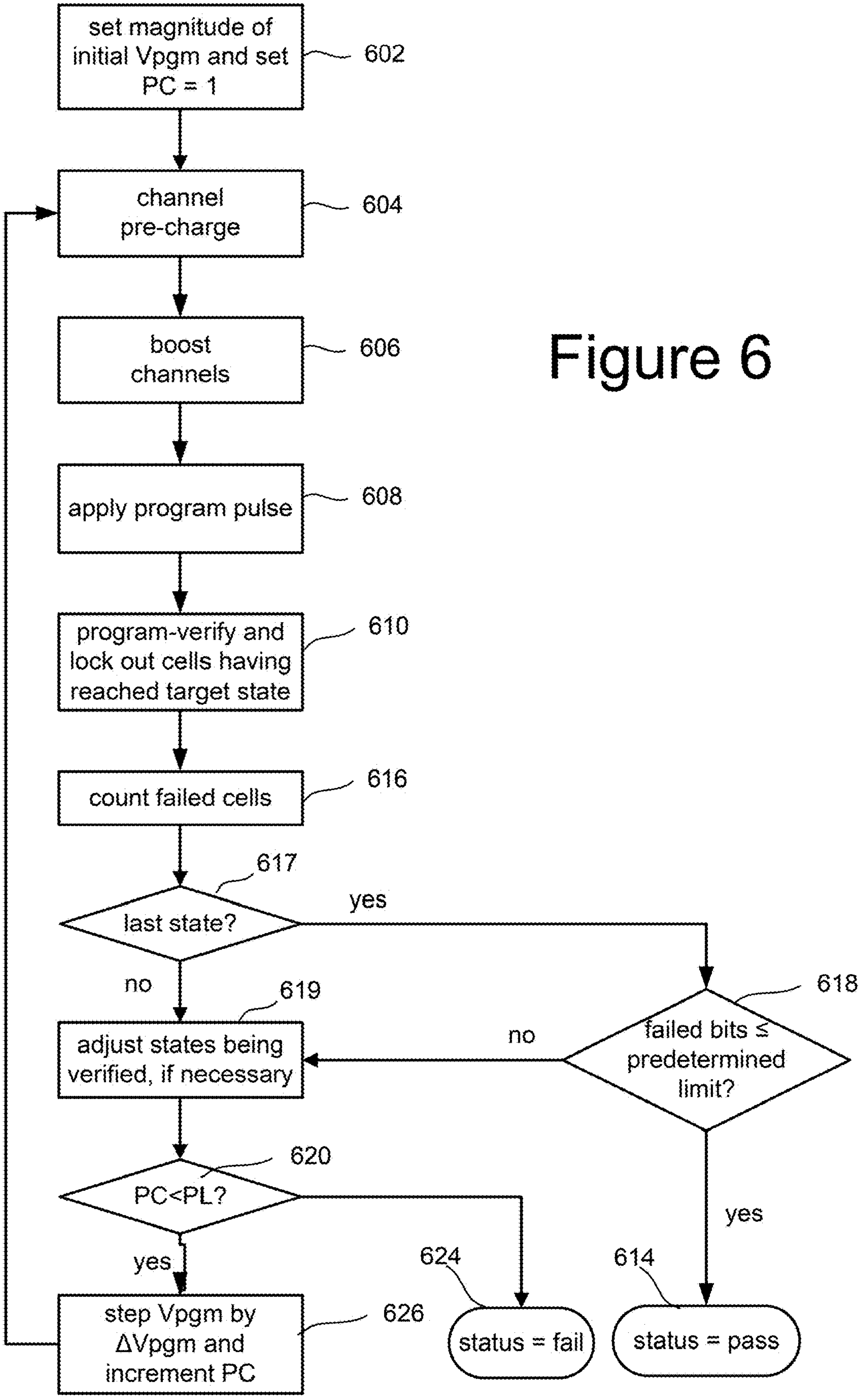
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program-verify is performed, which includes testing whether memory cells being programmed have successfully reached their target data state. Memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

In one embodiment of step 610, a smart verify technique is used such that the system only verifies a subset of data states during a program loop (steps 604-626). For example, the first program loop includes verifying for data state A (see FIG. 5C), depending on the result of the verify operation the second program loop may perform verify for data states A and B, depending on the result of the verify operation the third program loop may perform verify for data states B and C, and so on.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 617, the system determines whether the verify operation in the latest performance of step 610 included verifying for the last data state (e.g., data state G of FIG. 5C). If so, then in step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If in step 617 it was determined that the verify operation in the latest performance of step 610 did not include verifying for the last data state or in step 618 it was determined that the number of failed memory cells is not less than the predetermined limit, then in step 619 the data states that will be verified in the next performance of step 610 (in the next program loop) is adjusted as per the smart verify scheme discussed above. In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process continues at step 604 and another program pulse is applied to the selected word line (by the control die) so that another program loop (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a GIDL generation transistor (e.g., transistors connected to SGDT0, SGDT1, SGDT2, SGSB0, SGSB1 and SGSB2). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line, by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0, SGDT1, SGDT2) that is connected to or near a bit line to generate a first GIDL current. A second GIDL voltage may be created between two terminals of a GIDL generation transistor (e.g., SGSB0, SGSB1 and SGSB2) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

In one embodiment, the memory structure can be operated in sub-block mode, which allows any sub-block to be programmed or read individually. That is, SB1 (see FIG. 4C1) can be programmed before or after SB0 and/or SB2; SB0 can be programmed before or after SB1 and/or SB2; and SB2 can be programmed before or after SB0 and/or SB1. Any order of programming the sub-blocks can be used. Each sub-block can be read without reading the other sub-blocks. When programming a sub-block, the memory cells can be programmed in an order from source end toward bit line end (i.e. drain end) or from bit line end side to source end. As memory cells connected to a same word line are programmed concurrently, it is said that the memory cells are programmed in a word line order in the direction from the bit line end to the source end or from the source end to the bit line end. For example with respect to SB1 programming in a word line order in the direction from source end to bit line end comprises programming memory cells connected to WL90, followed by programming memory cells connected to WL91, followed by programming memory cells connected to WL92, programming memory cells connected to WL179. Programming SB1 in a word line order in the direction from the nit bit line end to source end comprises programming memory cells connected to WL179, followed by programming memory cells connected to WL178, followed by programming memory cells connected to WL177, . . . programming memory cells connected to WL90. In some examples, sub-blocks can be erased independently while in other examples, the entire block is erased at one time.

Some systems program memory cells by applying doses of programming to a selected word line that is connected to memory cells selected for programming (selected memory cells). Between the doses of programming, program-verify is performed to determine whether the programming was successful. Because a selected word line can be connected to selected memory cells and unselected memory cells (i.e. memory cells that are not supposed to be programmed), the system takes measures to avoid a disturb (e.g., unwanted programming) of unselected memory cells, including pre-charging and boosting the voltage of channels of unselected memory cells to prevent a disturb. The pre-charging is typically performed after program-verify and before the next dose of programming. The boosting is performed after the pre-charging. In some memories, under certain conditions, standard electron pre-charging does not work properly, as will be discussed below.

FIG. 7 depicts a NAND string being pre-charged (using electron pre-charging) as part of a process to inhibit the NAND string from programming during a programming process. In this example, the block that the depicted NAND string resides in is divided into two sub-blocks (Sub-block 1 and Sub-block 0) and the order of programming is from the bit line end to the source end (as depicted by arrow 802). It has been founds that programming memory cells in a word line order in the direction from the bit line end to the source end results in less interference between memory cells connected to neighbor word lines than programming memory cells in a word line order in the direction from the source end to the bit line end. In the example of FIG. 7, electron pre-charging is performed from the source side (see arrow 804), as the source line 806 is connected to VDDSA (a pre-charge voltage of ~2.0-2.5 v) and the bit line 808 is connected to a sense amplifier (S/A). All of the memory cells (via word lines) receive VCHPCH (~1.3 v). SGD represents the drain side select gate. SGS represents the source side select gate. DU is a dummy memory cell in Sub-block 1 and DL is a dummy memory cell in Sub-block 0 such that the border between Sub-block 0 and Sub-block 1 is between (or near) DU and DL. The target memory cell for programming is indicated by box 810, and resides in Sub-block 1.

FIG. 8 is a signal diagram describing the behavior of various signals for the structure of FIG. 7 during program-verify and electron pre-charging. FIG. 8 shows the following signals: UCG, CG, BL and SGS Selected. UCG is the signal applied to all unselected word lines. CG is the signal applied to the selected word line (the word line connected to the memory cells selected for programming). BL is the signal applied to the bit lines of the block. SGS selected is the signal applied to the source side selected lines (SGS0, SGS1, SGS2). At time ta, UCG is raised to Vread (e.g., 7-10 volts), a voltage spike is applied to CG, and SGS Selected is raised to VSG. Vread is an example of an overdrive voltage, such that an overdrive voltage is a voltage large enough to turn on the memory cells so they fully conduct current regardless of which data state the memory cell is in. Shortly after the voltage spike, CG is raised to VCG_RV, which can be any of the verify compare voltages (e.g., VvA, VvB, VvC, VVD, VVE, VVF, and VvG of FIG. 5C) and the bit lines BL are raised to Vsrc+Vbl (0.5-1.5 v). The voltage Vsrc is the voltage of the source line, not depicted in FIG. 8, which can be at ground or a low voltage near ground. While CG is at VCG_RV, the memory cells are sensed to see whether they have successfully reached their target threshold voltage (see step 610 of FIG. 6). Between tb and tc, all of the signals depicted in FIG. 8 are lowered to ground. Starting at time tc, the pre-charge process is performed (e.g., step 604 of FIG. 6) for the next program loop (steps 604-626 of FIG. 6). UCG and CG are raised to VCHPCH, the bit lines BL are raised to VHSA (~3.5 v), and SGS Selected is raised to VSGDPCH.

An issue regarding the channels of unselected NAND strings being pulled down to a negative voltage occurs between tb and tc. As the voltages ramp down on the word lines (CG and UCG), when the voltage on the word lines reach the threshold voltages of the memory cells, the channel will be cut off and will float. The floating channels couple to the word lines, but with the word lines continuing to ramp down the channel potential will become negative. Therefore, the pre-charging will start from a negative voltage. In some circumstances, the pre-charge will clear out the electrons in the channel and raise the potential of the channel to a positive voltage (e.g., 1-1.3 v). However, if the memory is in sub-block mode such that Sub-block 0 has already been programmed, when trying to program memory cells in Sub-Block 1, then a memory cell of Sub-Block 0 in a high data state (e.g. data state G—see FIG. 5C) may not turn on in response to VCPCH; thereby, keeping the channel cut off and maintaining the channel at the negative voltage during an attempted pre-charge. If the boosting of step 606 starts with the channel at a negative potential, then the boosting may not get the potential of the channel high enough to avoid a disturb to memory cells of the unselected NAND strings that are connected to the selected word line (CG). As an example, disturbed memory cells may have their threshold voltage increased, resulting in an error in the data being stored.

To overcome the issue of the NAND channel being at a negative voltage after the previous program-verify, it is proposed that the pre-charging of channels of unselected NAND strings be accomplished by performing hole pre-charging rather than electron pre-charging. Hole pre-charging a channel of a NAND string comprises creating holes and/or increasing the number of holes in the channel and extracting electrons from the channel because the electrons in the channel combine with the newly created holes. A goal of the pre-charging the channels is to raise the voltage of the channels to ~1-1.3 volts prior to the boosting.

Figure 9:
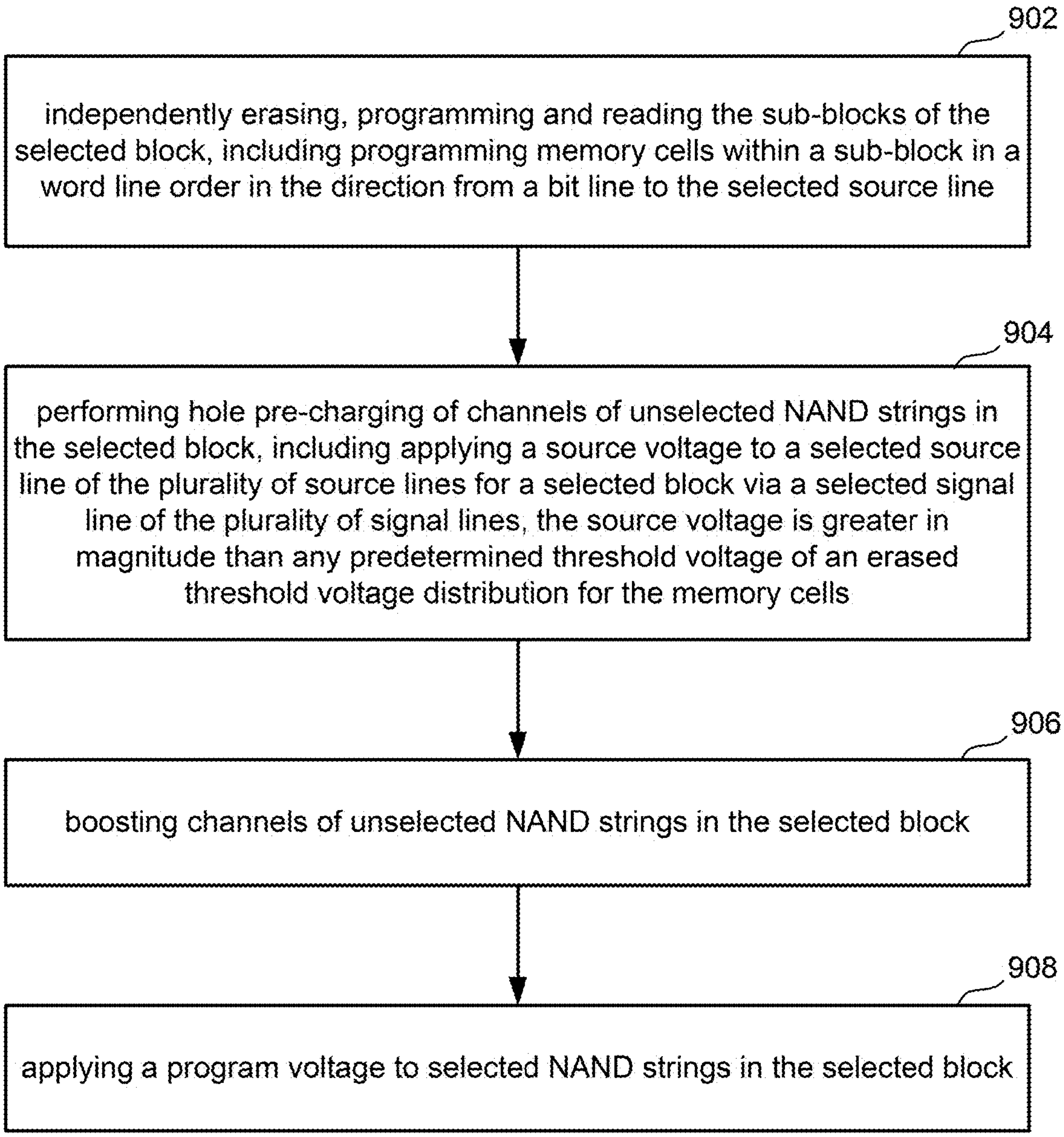
FIG. 9 is a flow chart describing one embodiment of a process for programming non-volatile memory.

FIG. 9 is a flow chart describing one embodiment of a process for programming memory cells in a sub-block that includes hole pre-charging of the channels of unselected memory cells. The process of FIG. 9 can be performed by any one of the one or more control circuits discussed above. The process of FIG. 9 can be performed entirely by a control circuit on memory die 200 (see FIG. 2A) or entirely by a control circuit on integrated memory assembly 207 (see FIG. 2B), rather than by memory controller 120. In one example, the process of FIG. 9 is performed by or at the direction of state machine 262, using other components of System Control Logic 260, Column Control Circuitry 210 and Row Control Circuitry 220. In another embodiment, the process of FIG. 9 is performed by or at the direction of memory controller 120. In one embodiment, the process of FIG. 9 is performed on a block of non-volatile memory cells such that the block is the unit of erase. In another embodiment, a different grouping of memory cells can be the unit of erase. In another embodiment, the process of FIG. 9 is performed on a different grouping of non-volatile memory cells. In one embodiments, the memory cells are arranged in sub-blocks; for example, the memory cells are arranged in at least a first sub-block and a second sub-block. Other embodiments can include more than two sub-blocks. In one embodiment, the sub-blocks correspond to tiers, while in other embodiments the sub-blocks do not have a one-to-one correspondence with tiers.

In step 902 of FIG. 9, the control circuit independently erases, programs and reads the sub-blocks of the selected block, including programming memory cells within a sub-block in a word line order in the direction from a bit line to the selected source line. In step 904, the control circuit performs hole pre-charging of channels of unselected NAND strings in the selected block, including applying a source voltage to a selected source line of the plurality of source lines for a selected block via a selected signal line of the plurality of signal lines. In one embodiment, the source voltage is greater in magnitude than any predetermined threshold voltage of an erased threshold voltage distribution for the memory cells. For example, in one embodiment the lowest voltage of the threshold voltage distribution for the erased memory cells (see e.g. the left edge of state Er of FIG. 5C) is −4 v. Therefore, the source voltage applied in step 904 is greater than 4 volts. One example of a suitable source voltage is 10 volts (in which case the source voltage is more than double in magnitude than any predetermined threshold voltage of an erased threshold voltage distribution); however, other voltage magnitudes can also be used. In one embodiment, the plurality of signal lines are isolated from each other and are connected to the selected plane, the selected signal line is positioned between the selected block and an unselected block and is connected to a selected source line of a plurality of source lines, and the plurality of source lines are connected to the plane such that the selected source line is connected to the selected block. In one embodiment, the source line is divided into multiple source lines that are isolated from each other. In one embodiment, the control circuit is configured to perform hole pre-charging by pre-charging from the source end of the NAND strings. Step 904 of FIG. 9 corresponds to step 604 of FIG. 6.

In step 906, the control circuit boosts channels of unselected NAND strings in the selected block. Step 906 of FIG. 9 corresponds to step 606 of FIG. 6. In step 908, the control circuit applies a program voltage to selected NAND strings in the selected block. Step 908 of FIG. 9 corresponds to step 608 of FIG. 6. Although FIG. 9 assumes the memory cells are arranged as NAND strings in blocks, in other embodiments the memory cells are in other groupings (e.g., other than NAND strings and/or other than in blocks).

Figure 10:
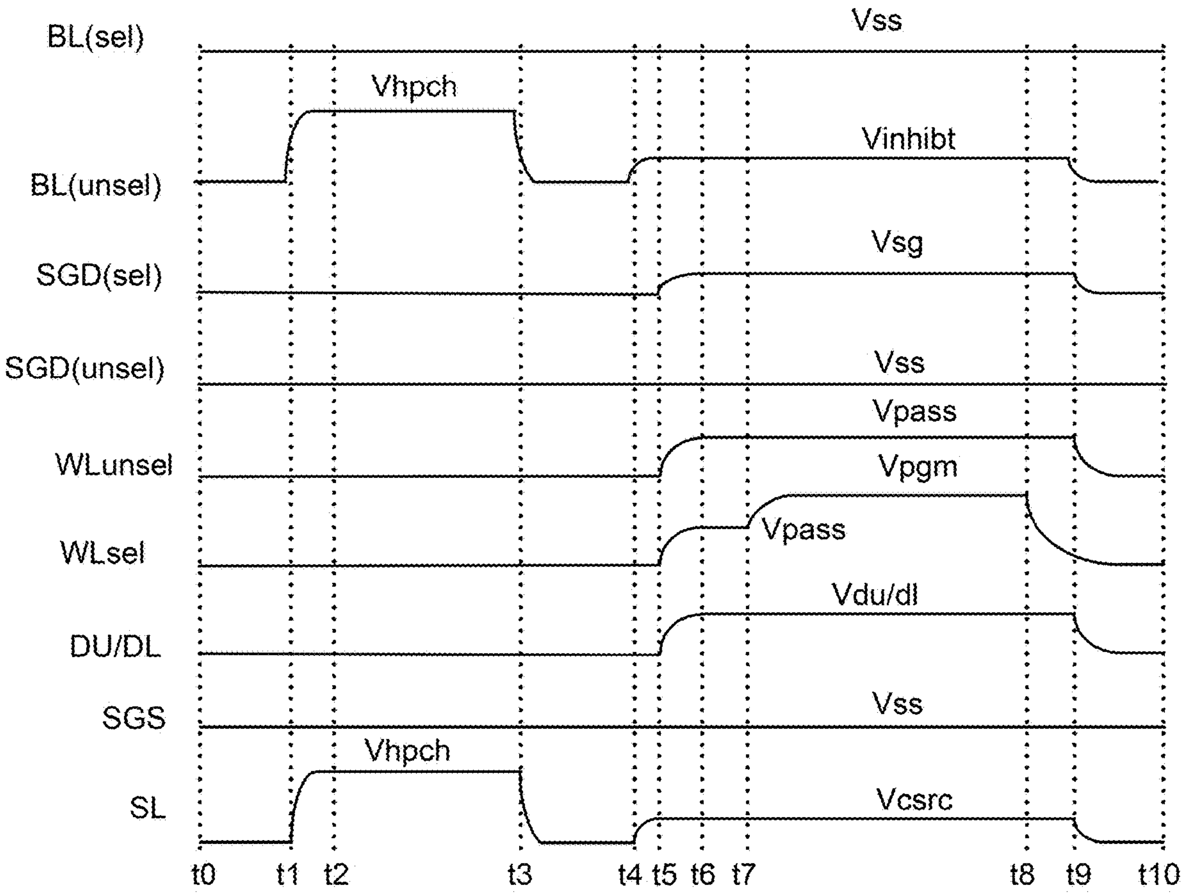
FIG. 10 is a timing diagram depicting the behavior of various signals during programming.

FIG. 10 is a signal timing diagram that shows the behavior of certain signals during the programming process of FIG. 9. In one embodiment, the process depicted in FIG. 10 is performed during steps 604-608 of FIG. 6. FIG. 10 depicts the following signals: BL(sel), BL(unsel), SGD(sel), SGD (unsel), WLunsel, WLsel, DU/DL, SGS and SL. The signal BL(sel) is the voltage applied to bit lines connected to NAND strings having memory cells selected for programming. The signal BL(unsel) is the voltage applied to bit lines connected to NAND strings that do not have any memory cells selected for programming. The signal SGD(sel) is the voltage applied to the drain side select (SGD) lines (e.g., SGD0, SGD1 and SGD2 connected together for one region) for the region (e.g., regions 430, 440, 450, 460 and 470) selected for programming. The signal SGD(unsel) is the voltage applied to the drain side select (SGD) lines (e.g., SGD0, SGD1 and SGD2 connected together for one region) for the region (e.g., regions 430, 440, 450, 460 and 470) not selected for programming. The signal WLsel is the voltage applied to the word line selected for programming. The signal WLunsel is the voltage applied to the word lines not selected for programming. DU/DL is the signal applied to the dummy word lines DU and DL, which are adjacent to the Joint area. SGS is the source side select lines (e.g., SGS0, SGS1 and SGS2 connected together for one region). SL is the source line.

The signals BL(sel), SGD(unsel) and SGS are kept at Vss (e.g., 0 volts or ground) during the time period of FIG. 10. At time t1, BL(unsel) is raised from ground to a pre-charge voltage Vhpch (e.g., ~10 volts) in order to allow for pre-charging (from the drain side or bit line side) as per step 604 of FIG. 6. That is, the time period of t1-t3 corresponds to step 604 and step 904, comprising the time when hole pre-charging occurs. At time t3, the unselected bit line voltage BL(unsel) is lowered Vss, raised to Vinhibit (e.g., ~3-5 volts) at t4 and then lowered down to ground at time t9. SGD (sel) remains at Vss during pre-charging and then is raised to Vsg at t5. Vsg is a voltage high enough to turn on the transistor for the select gate. The selected word lines WLsel, unselected word lines WLunsel and DU/DL remain at Vss during pre-charging (t1-t3). The source line(s) SL is/are raised from ground to Vhpch at time t1, and then lowered to ground at time t3, to enable hole pre-charging from the source side.

The time period of t5-t9 corresponds to step 606 and step 906, comprising the boosting of channels of unselected NAND strings. The time period of t7-t8 corresponds to step 608 and step 908. comprising the applying of the program voltage pulse. The unselected word lines WLunsel are raised to Vpass (e.g., 7-10 v) at time t5, and lowered to ground at time t9. The signal WLunsel is raised to Vpass in order to allow the boosting of step 606 of FIG. 6. The signal WLsel is raised to Vpass at time t7 and then raised to Vpgm (the programming voltage), and lowered down to ground at time t8. Note that the voltage on WLn between t7 and t8 represents the program voltage pulse used for programming (step 608 of FIG. 6). DU/DL is raised to Vdu/dl (e.g., ~6.2 v) at time t5, and lowered to ground at time t9. The source line(s) SL is/are raised from ground to Vcsrc (e.g., 2.5-3.5 volts) at time t4, and then lowered to ground at time t9.

Figure 11:
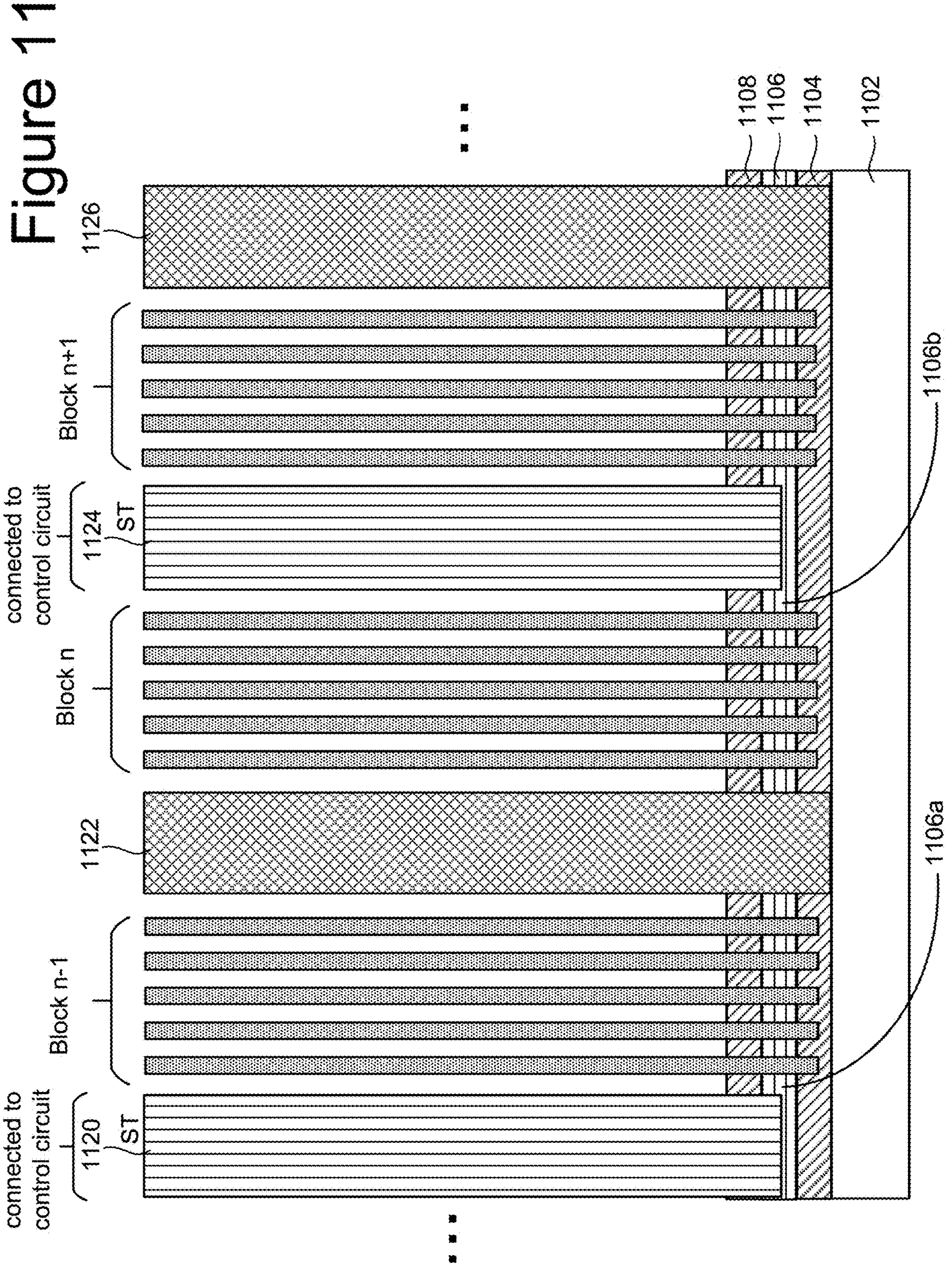
FIG. 11 is a block diagram showing a cutaway view of a portion of a plane.

In previous memory architectures, there is one source line connected to all NAND strings of the plane. Therefore, when a large voltage Vhpch (e.g., ~10 v) is applied to the source line SL, that large voltage is applied to all NAND strings of all blocks of the plane, which consumes a large amount of current. To reduce the consumption of current, it is proposed to divide the source line SL into multiple source lines. For example, in one embodiment there is one source line per block. In another embodiment, there is one source for every two blocks. In other embodiments, there can be one source line per X blocks such that each source line is connected to a subset of blocks for the plane. In embodiments where the source line is divided into multiple source lines, then the particular source line connected to the block selected for programming is referred to as the selected source line and the performing hole pre-charging of channels of unselected NAND strings comprises pre-charging from the selected source line In addition to dividing the source line into multiple source lines that are electrically isolated from each other, the signal lines ST (see FIG. 4B) that are connected to the source lines and voltage sources to bring the source voltage to the source line will also be electrically isolated for each other. This concept is graphically depicted in FIG. 11, which shows a cross section of a portion of a plane comprising three blocks (Block n−1, Block n and Block n+1). Each of the blocks is depicted as five elongated rectangles, which symbolically represent memory holes (vertical columns) that form NAND strings in the block. Only five elongated rectangles are depicted per block to keep the drawing simple, but a block is likely have more than five memory holes (vertical columns) that form NAND strings. The blocks are positioned above substrate 1102 (which corresponds to substrate 453 of FIG. 4C). Above substrate 1102 is polysilicon layer 1104 (P type Si that corresponds to polysilicon layer 454 of FIG. 4C), source line layer 1106 (n type Si), and polysilicon layer 1108 (P type Si that corresponds to polysilicon layer 455 of FIG. 4C). Between the blocks are the signal lines ST (e.g., 1120 and 1124) that are connected to voltage sources (not depicted in FIG. 11) of the control circuit. FIG. 11 only shows two signal lines ST because only three blocks are depicted; however, a plane of the memory will likely have many more blocks with many more signal lines ST. Each of the signal lines ST are electrically isolated from each other and can be separately controlled by the control circuit. FIG. 11 also shows isolation layers 1122 and 1126 (e.g., oxide) that serve to isolate the signal lines ST from each other. Isolation layers 1122 and 1126 also serve to divide the source line into multiple source lines and isolate the source lines from each other. For example, source line layer 1106 is divided into source line 1106*a* and 1106*b* by isolation layer 1122. By dividing the source line into multiple source lines that are isolated from each other and by isolating the signal lines ST, the source voltage Vhpch is only provided to a subset of the blocks of the plane; thereby, consuming less current. In the example of FIG. 11, each signal line ST is connected to two blocks and one source line (which is also only connected to the same two blocks); therefore, the source voltage Vhpch is only provided to two blocks rather than an entire plane. In other words, the applying the source voltage to the selected signal line charges up only the selected source line and does not charge up all other source lines of the plurality of source lines.

FIG. 11 provides an example of the control circuit (discussed above) including one or more voltage sources, and the signal lines (e.g., 1220 and 1224) connected to the one or more voltage sources and connected to the source lines (e.g., 1206*a* and 1206*b*) for applying voltage from the one or more voltage sources to the source lines.

Although FIG. 11 depicts blocks of memory cells, the memory cells can be organized in other types of groups of memory cells. Regardless of the type of group, FIG. 11 shows that each signal line of the plurality of signal lines is connected to a subset of the groups (e.g., two blocks) and each group is connected to one of the signal lines; each source line of the plurality of source lines is connected to a subset of the groups (e.g., two blocks) and each group is connected to one of the source lines; the isolation layers (1122 and 1126) are positioned between source lines to isolate the source lines from each other; and each signal line of the plurality of signal lines is positioned between two blocks and connected to one source line of the plurality of source lines.

A non-volatile memory system has been proposed that programs memory cells from an erased threshold voltage distribution to programmed threshold voltage distributions by performing hole pre-charging of channels of unselected NAND strings in a selected block of a selected plane including applying a source voltage to a selected signal line of a plurality of signal lines that are isolated from each other. This technology allows for a more reliable programming process t hat uses less current (e.g., thereby lowering power usage).

One embodiment includes a non-volatile storage apparatus, comprising: non-volatile memory cells arranged in groups; a plurality of source lines connected to the memory cells; a plurality of signal lines positioned between the groups, the signal lines are configured to apply a source voltage to the source lines; isolation layers between the signal lines to isolate the signal lines from each other; and a control circuit connected to the non-volatile memory cells and the signal lines, the control circuit is configured to program the memory cells by performing hole pre-charging followed by boosting and applying a program voltage, the control circuit is configured to performing hole pre-charging by applying the source voltage to a selected source line of the plurality of source lines for a selected group via a selected signal line of the plurality of signal lines.

One embodiment includes a method for programming memory cells from an erased threshold voltage distribution to one or more programmed threshold voltage distributions, comprising: performing hole pre-charging of channels of unselected NAND strings in a selected block of a selected plane including applying a source voltage to a selected signal line of a plurality of signal lines that are isolated from each other and are connected to the plane, the selected signal line is positioned between the selected block and an unselected block and is connected to a selected source line of a plurality of source lines, the plurality of source lines are connected to the plane such that the selected source line is connected to the selected block, the source voltage is greater in magnitude than any predetermined threshold voltage of the erased threshold voltage distribution; and after the pre-charging, boosting channels of unselected NAND strings in the selected block and applying a program voltage to selected NAND strings in the selected block.

One embodiment includes a non-volatile storage apparatus, comprising: non-volatile memory cells arranged as NAND strings in blocks; a plurality of source lines connected to the memory cells such that each source line is connected to a subset of the blocks and each block is connected to one of the source lines; a plurality of signal lines positioned between the blocks; isolation layers between the source lines to isolate the source lines from each other; and a control circuit connected to the non-volatile memory cells and the signal lines, the control circuit includes one or more voltage sources, the signal lines are connected to the one or more voltage sources and are connected to the source lines for applying voltage from the one or more voltage sources to the source lines, the control circuit is configured to program memory cells of a selected block by performing hole pre-charging of channels of unselected NAND strings in the selected block followed by boosting channels of unselected NAND strings in the selected block and applying a program voltage to selected NAND strings in the selected block, the control circuit is configured to perform hole pre-charging by applying a source voltage to a selected source line of the plurality of source lines for a selected block via a selected signal line of the plurality of signal lines, the source voltage is greater in magnitude than any predetermined threshold voltage of an erased threshold voltage distribution for the memory cells.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
non-volatile memory cells arranged in blocks;
a plurality of source lines connected to the memory cells, the plurality of source lines are electrically isolated from each other, each source line of the plurality of source lines is connected to a subset of the blocks;
a plurality of signal lines positioned between the blocks and connected to the plurality of source lines, the plurality of signal lines are configured to apply a source voltage to the plurality of source lines, signals lines of the plurality of signal lines are electrically isolated from each other;
isolation layers between signal lines of the plurality of signal lines to isolate the signal lines of the plurality of signal lines from each other; and
a control circuit connected to the non-volatile memory cells and the plurality of signal lines, each of the signals lines of the plurality of signal lines can be separately controlled by the control circuit, the control circuit is configured to program the memory cells by performing hole pre-charging followed by boosting and applying a program voltage, the control circuit is configured to perform the hole pre-charging by applying the source voltage to a selected source line of the plurality of source lines for a selected block via a selected signal line of the plurality of signal lines without applying the source voltage to all source lines of the plurality of source lines.

2. The non-volatile storage apparatus of claim 1, wherein:
each block is connected to a source line of the plurality of source lines; and
the isolation layers are positioned between source lines of the plurality of source lines to electrically isolate the source lines of the plurality of source lines from each other.

3. The non-volatile storage apparatus of claim 1, wherein:
the source voltage is greater in magnitude than any predetermined threshold voltage of an erased threshold voltage distribution for the memory cells.

4. The non-volatile storage apparatus of claim 1, wherein:
the source voltage is more than double in magnitude than any predetermined threshold voltage of an erased threshold voltage distribution for the memory cells.

5. The non-volatile storage apparatus of claim 1, wherein:
the applying the source voltage to the selected signal line charges up only the selected source line and does not charge up all other source lines of the plurality of source lines.

6. The non-volatile storage apparatus of claim 1, wherein:
each block is connected to one of the source lines of the plurality of source lines; and
each signal line of the plurality of signal lines is positioned between two blocks and connected to one source line of the plurality of source lines.

7. The non-volatile storage apparatus of claim 1, wherein:
the memory cells are arranged as NAND strings in the blocks.

8. The non-volatile storage apparatus of claim 1, wherein:
the non-volatile memory cells are arranged as NAND strings having a source end and a bit line end; and
the control circuit is configured to performing hole pre-charging by pre-charging from the source end.

9. The non-volatile storage apparatus of claim 8, wherein:

the control circuit is configured to program the memory cells in a word line order in the direction from the bit line end to the source end.

10. The non-volatile storage apparatus of claim 1, wherein:

the apparatus further comprises word lines connected to the memory cells;

the memory cells are arranged as NAND strings in the blocks;

the NAND strings include a source end and a bit line end;

each block of memory cells is divided into sub-blocks that can be independently erased and programmed; and the control circuit is configured to program the memory cells within a sub-block in a word line order in the direction from the bit line end to the source end.

11. The non-volatile storage apparatus of claim 1, wherein:

the memory cells are arranged as NAND strings in the blocks;

the source voltage is greater in magnitude than any predetermined threshold voltage of an erased threshold voltage distribution for the memory cells;

the applying the source voltage to the selected source line charges up only the selected source line and does not charge up all other source lines of the plurality of source lines;

each source line of the plurality of source lines is connected to a subset of the blocks and each block is connected to one of the source lines of the plurality of source lines;

each signal line of the plurality of signal lines is positioned between two blocks and connected to one source line of the plurality of source lines; and the control circuit is configured to program memory cells of a selected block by performing hole pre-charging of channels of unselected NAND strings in the selected block followed by boosting channels of unselected NAND strings in the selected block and applying a program voltage to selected NAND strings in the selected block.

12. A method for programming memory cells from an erased threshold voltage distribution to one or more programmed threshold voltage distributions, comprising:

performing hole pre-charging of channels of unselected NAND strings in a selected block of a selected plane including applying a source voltage to a selected signal line of a plurality of signal lines that are electrically isolated from each other and are connected to the plane, the selected signal line is positioned between the selected block and an unselected block and is connected to a selected source line of a plurality of source lines, the plurality of source lines are connected to the plane such that the selected source line is connected to the selected block and unselected source lines are not connected to the selected block, each source line of the plurality of source lines is connected to a subset of blocks of the plane, the source voltage is greater in magnitude than any predetermined threshold voltage of the erased threshold voltage distribution, the performing hole pre-charging includes applying the source voltage to the selected source line of the plurality of source lines without applying the source voltage to all source lines of the plurality of source lines; and after the pre-charging, boosting channels of unselected NAND strings in the selected block and applying a program voltage to selected NAND strings in the selected block.

13. The method of claim 12, wherein:

the applying the source voltage to the selected signal line charges up only the selected source line and does not charge up all other source lines of the plurality of source lines.

14. The method of claim 12, wherein:

the selected block is divided into sub-blocks;

the method further comprises independently erasing and programming the sub-blocks of the selected block, including programming memory cells within a sub-block in a word line order in the direction from a bit line to the selected source line;

the performing hole pre-charging of channels of unselected NAND strings comprises pre-charging from the selected source line; and the applying the source voltage to the selected signal line charges up only the selected source line and does not charge up all other source lines of the plurality of source lines.

15. The method of claim 12, wherein:

each source line of the plurality of source lines is connected to a subset of blocks and each block is connected to one of the source lines; and each signal line of the plurality of signal lines is positioned between two blocks and connected to one source line of the plurality of source lines.

16. A non-volatile storage apparatus, comprising:

non-volatile memory cells arranged as NAND strings in blocks;

a plurality of source lines connected to the memory cells such that each source line of the plurality of source lines is connected to a subset of the blocks and each block is connected to one of the source lines of the plurality of source lines;

a plurality of signal lines positioned between the blocks;

isolation layers positioned between the blocks, the isolation layers electrically isolate source lines of the plurality of source lines from each other; and a control circuit connected to the non-volatile memory cells and the plurality of signal lines, the control circuit includes one or more voltage sources, the plurality of signal lines are connected to the one or more voltage sources and are connected to the plurality of source lines for applying voltage from the one or more voltage sources to the plurality of source lines, the control circuit is configured to program memory cells of a selected block by performing hole pre-charging of channels of unselected NAND strings in the selected block followed by boosting channels of unselected NAND strings in the selected block and applying a program voltage to selected NAND strings in the selected block, the control circuit is configured to perform hole pre-charging by applying a source voltage to a selected source line of the plurality of source lines for a selected block via a selected signal line of the plurality of signal lines without applying the source voltage to all source lines of the plurality of source lines, the source voltage is greater in magnitude than any predetermined threshold voltage of an erased threshold voltage distribution for the memory cells.

17. The non-volatile storage apparatus of claim 16, wherein:

the apparatus further comprises word lines connected to the memory cells;

the NAND strings include a source end and a bit line end;

each block of memory cells is divided into sub-blocks that can be independently erased and programmed;

the control circuit is configured to program the memory cells within a sub-block in a word line order in the direction from the bit line end to the source end;

the control circuit is configured to performing hole pre-charging by pre-charging from the source end; and the applying the source voltage to the selected signal line charges up only the selected source line and does not charge up all other source lines of the plurality of source lines.

18. The non-volatile storage apparatus of claim 16, wherein:

each source line of the plurality of source lines is connected to a subset of the blocks and each block is connected to one source line of the plurality of source lines; and each signal line of the plurality of signal lines is positioned between two blocks and connected to one source line of the plurality of source lines.

19. The non-volatile storage apparatus of claim 1, further comprising:

multiple voltage sources connected to the plurality of signal lines.

* * * * *